United States Patent
Kang et al.

(10) Patent No.: US 11,018,026 B2
(45) Date of Patent: May 25, 2021

(54) INTERPOSER, SEMICONDUCTOR PACKAGE, AND METHOD OF FABRICATING INTERPOSER

(71) Applicant: SAMSUNG ELECTRONICS CO., LTD., Suwon-si (KR)

(72) Inventors: Un-Byoung Kang, Hwaseong-si (KR); Tae-Je Cho, Yongin-si (KR); Hyuek-Jae Lee, Hwaseong-si (KR); Cha-Jea Jo, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/699,283

(22) Filed: Nov. 29, 2019

(65) Prior Publication Data

US 2020/0144076 A1 May 7, 2020

Related U.S. Application Data

(63) Continuation of application No. 15/586,716, filed on May 4, 2017, now Pat. No. 10,535,534.

(30) Foreign Application Priority Data

May 12, 2016 (KR) .................. 10-2016-0058234

(51) Int. Cl.
*H05K 1/11* (2006.01)
*H05K 1/18* (2006.01)
(Continued)

(52) U.S. Cl.
CPC .......... *H01L 21/4857* (2013.01); *B05D 1/005* (2013.01); *B05D 1/32* (2013.01);
(Continued)

(58) Field of Classification Search
CPC ............. H01L 21/4857; H01L 23/4334; H01L 23/49822; H01L 21/486;
(Continued)

(56) References Cited

U.S. PATENT DOCUMENTS

| 7,189,594 B2* | 3/2007 | Kripesh .............. H01L 23/3114 257/690 |
| 7,745,910 B1 | 6/2010 | Olson et al. |

(Continued)

FOREIGN PATENT DOCUMENTS

| KR | 10-0694979 | 3/2007 |
| KR | 10-1538539 | 7/2015 |

*Primary Examiner* — Ishwarbhai B Patel
(74) *Attorney, Agent, or Firm* — F.Chau & Associates, LLC

(57) ABSTRACT

A semiconductor package includes: a plurality of unit redistribution layers vertically stacked, each including: a first polymer layer having a first via hole pattern; a second polymer layer formed on the first polymer layer, and having a redistribution pattern on the first polymer layer and a second via hole pattern in the first via hole pattern; a seed layer covering sidewalls and bottom surfaces of the redistribution pattern and the second via hole pattern; a conductive via plug formed in the second via hole pattern; and a conductive redistribution line formed in the redistribution pattern; a connection terminal disposed on a bottom surface of a lowermost unit redistribution layer and electrically connected to the conductive via plug; a semiconductor device mounted on the unit redistribution layers with a conductive terminal interposed therebetween. Upper surfaces of the second polymer layer, the conductive redistribution line and the conductive via plug are substantially coplanar.

17 Claims, 26 Drawing Sheets

(51) Int. Cl.

| | | |
|---|---|---|
| *H01L 21/48* | (2006.01) | |
| *H05K 3/46* | (2006.01) | |
| *C23C 18/00* | (2006.01) | |
| *H01L 23/433* | (2006.01) | |
| *H01L 23/498* | (2006.01) | |
| *B05D 1/00* | (2006.01) | |
| *B05D 1/32* | (2006.01) | |
| *B05D 1/38* | (2006.01) | |
| *B05D 3/02* | (2006.01) | |
| *B05D 7/00* | (2006.01) | |
| *C23C 14/02* | (2006.01) | |
| *C23C 14/04* | (2006.01) | |
| *C23C 14/06* | (2006.01) | |
| *C23C 14/20* | (2006.01) | |
| *C23C 14/34* | (2006.01) | |
| *C23C 14/58* | (2006.01) | |
| *C23C 18/38* | (2006.01) | |
| *H01L 23/00* | (2006.01) | |
| *H01L 25/03* | (2006.01) | |
| *H01L 23/473* | (2006.01) | |
| *H01L 23/538* | (2006.01) | |
| *H01L 25/065* | (2006.01) | |
| *H05K 1/14* | (2006.01) | |

(52) U.S. Cl.
CPC ............ *B05D 1/38* (2013.01); *B05D 3/0209* (2013.01); *B05D 7/546* (2013.01); *C23C 14/024* (2013.01); *C23C 14/046* (2013.01); *C23C 14/0641* (2013.01); *C23C 14/205* (2013.01); *C23C 14/34* (2013.01); *C23C 14/588* (2013.01); *C23C 18/00* (2013.01); *H01L 21/486* (2013.01); *H01L 23/4334* (2013.01); *H01L 23/49822* (2013.01); *H05K 1/181* (2013.01); *H05K 3/465* (2013.01); *H05K 3/4682* (2013.01); *C23C 18/38* (2013.01); *H01L 23/473* (2013.01); *H01L 23/5385* (2013.01); *H01L 24/13* (2013.01); *H01L 24/16* (2013.01); *H01L 24/73* (2013.01); *H01L 24/81* (2013.01); *H01L 25/03* (2013.01); *H01L 25/0655* (2013.01); *H01L 2224/0401* (2013.01); *H01L 2224/13111* (2013.01); *H01L 2224/16227* (2013.01); *H01L 2224/73253* (2013.01); *H01L 2224/81005* (2013.01); *H01L 2224/97* (2013.01); *H01L 2924/1431* (2013.01); *H01L 2924/1434* (2013.01); *H01L 2924/1437* (2013.01); *H01L 2924/15311* (2013.01); *H01L 2924/18161* (2013.01); *H05K 1/11* (2013.01); *H05K 1/144* (2013.01); *H05K 2201/10378* (2013.01); *H05K 2203/025* (2013.01); *H05K 2203/0588* (2013.01)

(58) Field of Classification Search
CPC . H01L 2924/15311; H01L 2924/18161; H01L 2224/73253; H01L 2224/81005; H01L 2224/13111; H01L 2924/1434; H01L 24/73; H01L 25/03; H01L 23/473; H01L 23/5385; H01L 2924/1431; H01L 25/0655; H01L 24/13; H01L 2224/16227; H01L 2224/97; H01L 2924/1437; H01L 24/81; H01L 24/16; H01L 2224/0401; H01L 21/027; H01L 21/50; H01L 23/31; H01L 23/481; H01L 24/27; H05K 3/465; H05K 3/4682; H05K 2203/0588; H05K 2201/10378; H05K 2203/025; C23C 18/00; C23C 14/024; C23C 14/046; C23C 14/0641; C23C 14/205; C23C 14/34; C23C 14/588; C23C 18/38; B05D 1/005; B05D 1/32; B05D 1/38; B05D 3/0209; B05D 7/546

See application file for complete search history.

(56) References Cited

U.S. PATENT DOCUMENTS

| | | | |
|---|---|---|---|
| 8,704,373 | B2 | 4/2014 | Hotta et al. |
| 8,927,899 | B2 | 1/2015 | Hofmann |
| 9,173,291 | B2 | 10/2015 | Han et al. |
| 9,209,156 | B2 | 12/2015 | Len et al. |
| 2003/0003724 | A1 | 1/2003 | Uchiyama et al. |
| 2003/0213980 | A1 | 11/2003 | Tanaka et al. |
| 2006/0017161 | A1 | 1/2006 | Chung et al. |
| 2010/0078771 | A1 | 4/2010 | Barth et al. |
| 2011/0037158 | A1* | 2/2011 | Youn ............... H01L 24/33 257/686 |
| 2011/0095367 | A1 | 4/2011 | Su et al. |
| 2013/0020719 | A1 | 1/2013 | Jung et al. |
| 2014/0264859 | A1* | 9/2014 | Chen ............... H01L 21/56 257/738 |
| 2014/0299476 | A1* | 10/2014 | Yasuda ............. C25D 5/18 205/131 |
| 2015/0014851 | A1* | 1/2015 | Lu ............... H01L 21/566 257/738 |
| 2015/0084206 | A1* | 3/2015 | Lin ............... H01L 23/5389 257/774 |
| 2015/0262948 | A1 | 9/2015 | Lu et al. |
| 2015/0380350 | A1 | 12/2015 | Yu et al. |
| 2016/0064338 | A1* | 3/2016 | Miao ............... H01L 23/3185 257/620 |
| 2017/0005052 | A1* | 1/2017 | Chen ............... H01L 21/76885 |
| 2017/0330767 | A1 | 11/2017 | Kang et al. |

* cited by examiner

LASER

INTERPOSER, SEMICONDUCTOR PACKAGE, AND METHOD OF FABRICATING INTERPOSER

CROSS-REFERENCE TO RELATED APPLICATIONS

This application is a continuation of U.S. application Ser. No. 15/586,716 filed on May 4, 2017, now U.S. Pat. No. 10,535,534, issued Jan. 14, 2020, which claims the benefit under 35 U.S.C. § 119 of Korean Patent Application No. 10-2016-0058234, filed on May 12, 2016, in the Korean Intellectual Property Office, the disclosures of which are incorporated by reference herein in their entirety.

TECHNICAL FIELD

The inventive concept relates to an interposer, a semiconductor package, and a method of fabricating the interposer, and more particularly, to an interposer, a semiconductor package, and a method of fabricating the interposer, which are capable of enhancing device reliability and realizing pattern accuracy, with no undercut under a conductive structure and no bubbles between adjacent conductive structures.

DISCUSSION OF RELATED ART

As semiconductors are highly integrated, advances in integrating printed circuit boards are also needed. In some instances, a package structure, in which an interposer for redistributing signals/data is interposed between a semiconductor chip and a package substrate, is used. Since an interposer using a silicon substrate is difficult to fabricate and is also costly, a relatively low-cost redistribution (RDL) interposer that can also be mass-produced would be desirable.

SUMMARY

According to an aspect of the inventive concept, there is provided a method of fabricating an interposer, the method including: providing a carrier substrate; forming a unit redistribution layer on the carrier substrate, the unit redistribution layer including a conductive via plug and a conductive redistribution line; and removing the carrier substrate from the unit redistribution layer, in which the forming of the unit redistribution layer includes: forming a first photosensitive pattern layer including a first via hole pattern; forming a second photosensitive pattern layer on the first photosensitive pattern layer, the second photosensitive pattern layer including a second via hole pattern and a redistribution pattern; at least partially filling insides of the first via hole pattern, the second via hole pattern, and the redistribution pattern with a conductive material; and planarizing the unit redistribution layer to form a flat top surface.

According to another aspect of the inventive concept, there is provided an interposer including at least one unit redistribution layer, in which the at least one unit redistribution layer includes a conductive via plug and a conductive redistribution line, and each unit redistribution layer of the at least one unit redistribution layer has a flat top surface.

According to a further aspect of the inventive concept, there is provided a semiconductor package including: a package substrate; and one or more semiconductor devices mounted on the package substrate, in which the package substrate includes at least one unit redistribution layer including a conductive via plug and a conductive redistribution line, which are buried in an interlayer dielectric, and a sidewall and a bottom surface of at least one of the conductive via plug and the conductive redistribution line are lined with a hetero metal layer having a hetero metal that is different from a metal or metals of the conductive via plug and the conductive redistribution line.

According to yet another aspect of the inventive concept, there is provided a package substrate including at least one unit redistribution layer, in which the at least one unit redistribution layer includes a conductive via plug and a conductive redistribution line, which are buried in an organic insulating material, and a sidewall and a bottom surface of at least one of the conductive via plug and the conductive redistribution line are lined with a hetero metal layer having a hetero metal that is different from a metal or metals of the conductive via plug and the conductive redistribution line.

According to yet another aspect of the inventive concept, there is provided a method of fabricating an interposer, the method including: providing a carrier substrate; forming a unit redistribution layer on the carrier substrate, the unit redistribution layer including a conductive via plug and a conductive redistribution line; and removing the carrier substrate from the unit redistribution layer, in which the forming of the unit redistribution layer includes: forming a first photosensitive material layer on the carrier substrate; exposing the first photosensitive material layer with a first negative mask including a first mask pattern for printing a first via hole pattern; forming a second photosensitive material layer on the exposed first photosensitive material layer; exposing the exposed first photosensitive material layer and the second photosensitive material layer with a second negative mask including a second mask pattern for printing a second via hole pattern and a first redistribution pattern; developing the twice exposed first photosensitive material layer and the exposed second photosensitive material layer to form a first photosensitive pattern layer and a second photosensitive pattern layer, which include a third via hole pattern and a second redistribution pattern; at least partially filling insides of the third via hole pattern and the second redistribution pattern with a conductive material; and planarizing the unit redistribution layer to form a flat top surface.

According to the inventive concept, since a seed layer, the conductive via plug, and the conductive redistribution line are formed after the first and second photosensitive pattern layers are formed, no undercut occurs under these conductive structures. In addition, since the seed layer extends up to a sidewall of a conductive structure as well as on a bottom surface of the conductive structure, a concern of causing damage to the conductive structure is reduced. Further, there is no concern that there are bubbles between adjacent conductive via plugs or conductive redistribution lines. Furthermore, since the top surface of the unit redistribution layer is flat and thus optically stable for accurate exposure in the formation of a subsequent unit redistribution layer, more accurate patterning can be achieved.

BRIEF DESCRIPTION OF THE DRAWINGS

Exemplary embodiments of the inventive concept will be more clearly understood from the following detailed description taken in conjunction with the accompanying drawings in which.

Figure 1A:
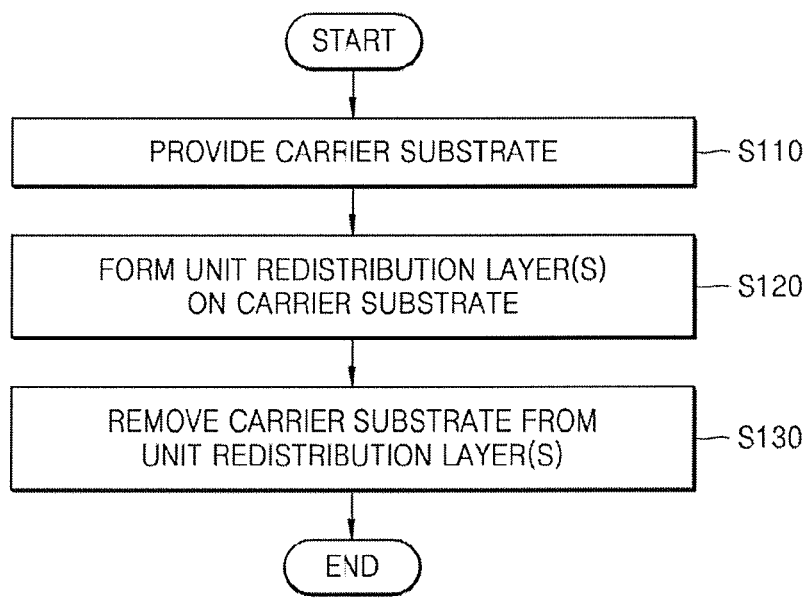
FIG. 1A is a flowchart showing a method of fabricating an interposer according to a process order, according to an exemplary embodiment of the inventive concept.

Since the drawings in FIGS. 1-11 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Figure 2A:
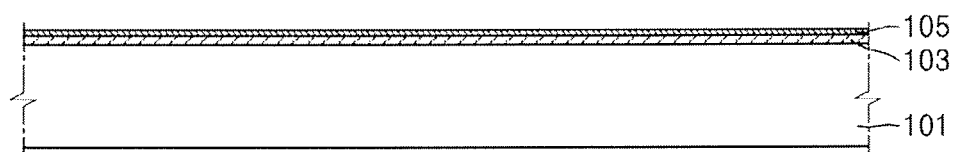
FIGS. 2A to 2X are side cross-sectional views showing a method of fabricating an interposer according to a process order, according to an exemplary embodiment of the inventive concept.

FIG. 1A is a flowchart showing a method of fabricating an interposer according to a process order, according to an exemplary embodiment of the inventive concept. FIGS. 2A to 2X are side cross-sectional views showing a method of fabricating an interposer according to a process order, according to an exemplary embodiment of the inventive concept.

Referring to FIGS. 1A and 2A, a carrier substrate 101 is provided (S110). The carrier substrate 101 may be used to support materials in the process of forming an interposer, and may be removed from the interposer afterward, as needed. Removing the carrier substrate from the interposer may be performed by, for example, laser ablation, ultraviolet light (UV) irradiation, chemical solvent bath demounting, or mechanical peeling.

The carrier substrate 101 may support an organic insulating layer, and may include any material having stability with respect to a baking process, an etching process, and the like used in the process of forming an interposer. In addition, if the intention is to separate and remove the carrier substrate 101 by laser ablation in a subsequent process, the carrier substrate 101 may be a transparent substrate. Optionally, if the intention is to separate and remove the carrier substrate 101 by laser ablation in a subsequent process, the carrier substrate 101 may be a heat resistant substrate. In an exemplary embodiment of the inventive concept, the carrier substrate 101 may be a glass substrate. In an exemplary embodiment of the inventive concept, the carrier substrate 101 may include a heat resistant organic polymeric material such as, for example, polyimide (PI), polyetheretherketone (PEEK), polyethersulfone (PES), polyphenylene sulfide (PPS), or the like, without being limited thereto.

In an exemplary embodiment of the inventive concept, a laser reactive layer 103 may be provided on the carrier substrate 101. The laser reactive layer 103 may react to laser irradiation and thus enables the carrier substrate 101 to be separated afterward. The laser reactive layer 103 may be a carbon-based material layer. For example, the laser reactive layer 103 may be an amorphous carbon layer (ACL), or a spin-on-hardmask (SOI) including a hydrocarbon compound or derivatives thereof, in which the hydrocarbon compound may have a relatively high carbon content of about 85 wt % to about 99 wt % based on the total weight of the hydrocarbon compound.

A protective layer 105 may be further formed on the laser reactive layer 103. The protective layer 105 may prevent contamination caused by material diffusion between the laser reactive layer 103 and a material layer added in a subsequent process. In addition, the protective layer 105 may prevent a material layer added in a subsequent process from being affected by laser irradiation during the separation of the carrier substrate 101 from the interposer.

The protective layer 105 may be a metal layer including a single layer or multiple layers. For example, the protective layer 105 may include copper (Cu), titanium (Ti), titanium tungsten (TiW), titanium nitride (TiN), tantalum (Ta), tantalum nitride (TaN), chromium (Cr), aluminum (Al), or the like. However, the protective layer 105 is not limited to the materials set forth above.

Figure 1B:
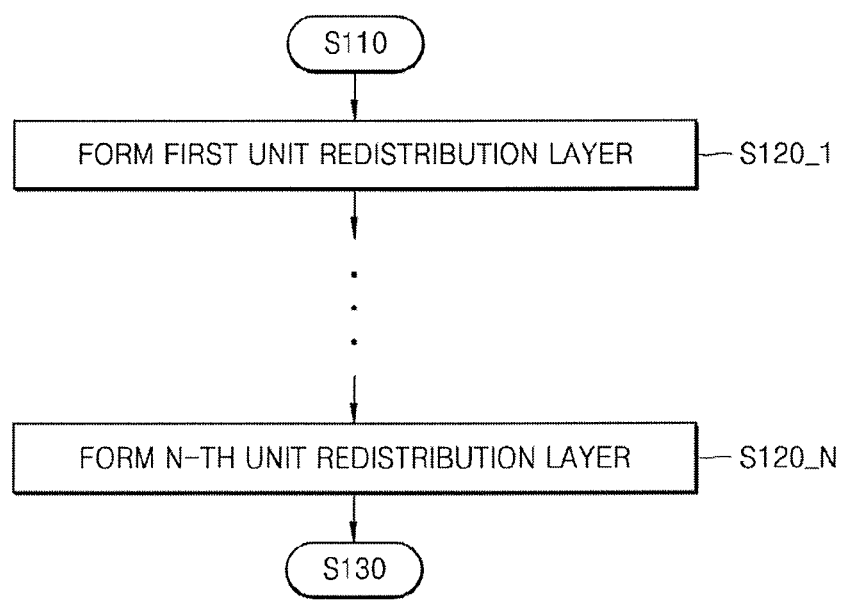
FIG. 1B is a flowchart showing an operation of forming one or more unit redistribution layers in more detail according to an exemplary embodiment of the inventive concept.
Figure 2B:
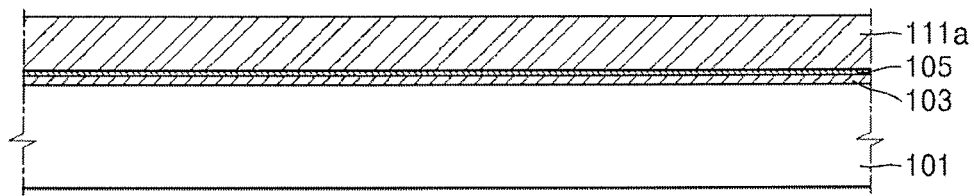

Referring to FIGS. 1A and 2B, one or more unit redistribution layers may be formed on the protective layer 105, in which the one or more unit redistribution layers may include a conductive via plug and a conductive redistribution line (S120). FIG. 1B is a flowchart showing operation S120 of forming the one or more unit redistribution layers in more detail.

Referring to FIG. 1B, the one or more unit redistribution layers may be sequentially formed, and operation S120_1 of forming a first unit redistribution layer, . . . , and operation S120_N of forming an N-th unit redistribution layer may be performed in this stated order. The first unit redistribution layer, . . . , and the N-th unit redistribution layer, which may be stacked in a thickness direction of the interposer. The thickness direction of the interposer is a direction perpendicular to a surface plane of the carrier substrate 101.

Figure 1C:
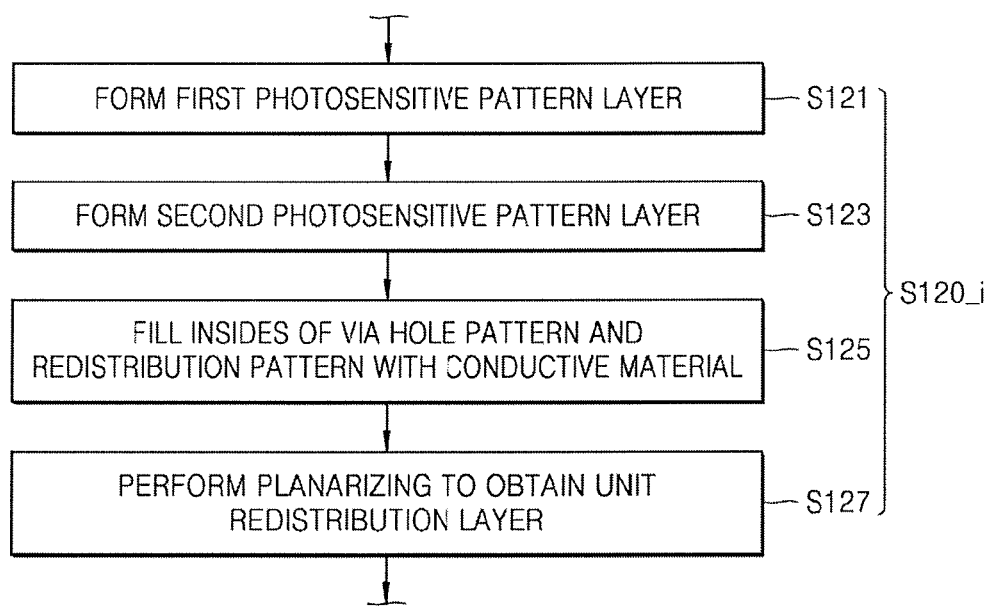
FIG. 1C is a flowchart showing an operation of forming an i-th unit redistribution layer in more detail, of the operation of forming the one or more unit redistribution layers according to an exemplary embodiment of the inventive concept.

FIG. 1C is a flowchart showing operation S120_i of forming an i-th unit redistribution layer in more detail, of operation 120 of forming the one or more unit redistribution layers. Operation S120_*i* is a representative example for any of the operations S120_1, . . . , and S120_N.

Referring to FIGS. 1C and 2B, a first photosensitive material layer 111*a* may be formed on the protective layer 105. The first photosensitive material layer 111*a* may be a material layer including an organic compound, and may be a dielectric layer. In an exemplary embodiment of the inventive concept, the first photosensitive material layer 111*a* may be a material layer including an organic polymeric material. In an exemplary embodiment of the inventive concept, the first photosensitive material layer 111*a* may include a polymeric material having negative photosensitivity. In an exemplary embodiment of the inventive concept, the first photosensitive material layer 111*a* may include a photosensitive polyimide (PSPI) resin having negative photosensitivity.

In an exemplary embodiment of the inventive concept, the first photosensitive material layer 111*a* may be formed by spin coating and soft baking. For example, the soft baking may be performed by heating the first photosensitive material layer 111*a* to a temperature of about 150° C. to about 350° C. for about 10 seconds to about 5 minutes, without being limited thereto.

Figure 2C:
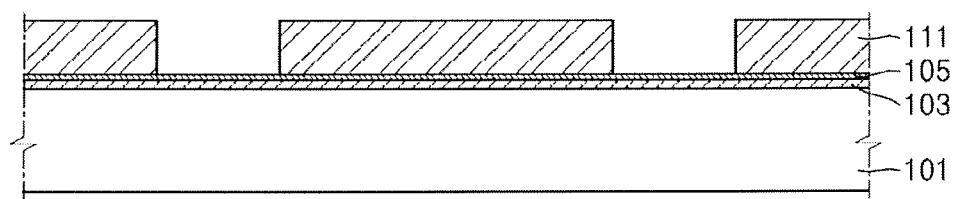

Referring to FIGS. 1C and 2C, a first photosensitive pattern layer 111 may be formed by exposure and development (S121). When the first photosensitive material layer 111*a* includes a polymeric material having negative photosensitivity, a removed portion in FIG. 2C is blocked from light during exposure process, and a remaining portion in FIG. 2C is exposed to light. In this case, the first photosensitive material layer 111*a*, is first exposed with a radiation through a photomask, and is then processed with a typical photolithographic process, such as baking and then developing with a developer, to form the first photosensitive pattern layer 111. The exposure may also be carried out without photomask, such as with e-beam, ion-beam, or laser beam direct write, or with light scanning using an optical scanner. A photomask is an opaque plate with holes or transparencies that allow light to shine through in a defined pattern. Since the polymeric material for the first photosensitive material layer 111*a* has negative photosensitivity, the mask used in the exposure is a negative mask which contains the inverse or photographic "negative" of the pattern to be transferred. That is, the opaque area of the mask corresponds to the open area of the first photosensitive pattern layer 111. In addition, although the exemplary embodiment of the inventive concept, in which both exposure and development are performed, is described here, in an exemplary embodiment of the inventive concept, after only exposure on the first photosensitive material layer 111*a* is performed, development may be performed once after exposure of a second photosensitive material layer 113*a* is also performed. This will be described in more detail below with reference to FIGS. 3A to 3D.

The first photosensitive pattern layer 111 may include only a via hole pattern, or include a via hole pattern and a redistribution pattern. The above described exposure process may include exposing the first photosensitive material layer 111*a* coated structure with a negative mask containing a mask pattern for printing the via hole pattern only, or both the via hole pattern and the redistribution pattern. As described previously, the actual pattern in the negative mask may contain the inverse of the hole pattern and the redistribution pattern to be transferred. The protective layer 105 may be exposed by a recessed portion of the first photosensitive pattern layer 111.

Figure 2D:
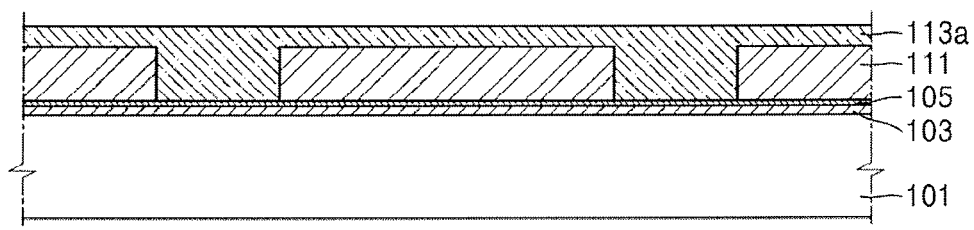

Referring to FIGS. 1C and 2D, to form the second photosensitive pattern layer 113 on the first photosensitive pattern layer 111 and the exposed protective layer 105, a second photosensitive material layer 113*a* may be formed on the first photosensitive pattern layer 111 and the exposed protective layer 105.

The second photosensitive material layer 113*a* may be a material layer including an organic compound, and may be a dielectric layer. In an exemplary embodiment of the inventive concept, the second photosensitive material layer 113*a* may be a material layer including an organic polymeric material. In an exemplary embodiment of the inventive concept, the second photosensitive material layer 113*a* may include a polymeric material having negative photosensitivity. In an exemplary embodiment of the inventive concept, the second photosensitive material layer 113*a* may include a PSPI resin having negative photosensitivity.

In an exemplary embodiment of the inventive concept, the second photosensitive material layer 113*a* may be formed by spin coating and soft baking. For example, the soft baking may be performed by heating the second photosensitive material layer 113*a* to a temperature of about 150° C. to about 350° C. for about 10 seconds to about 5 minutes, without being limited thereto.

Figure 2E:
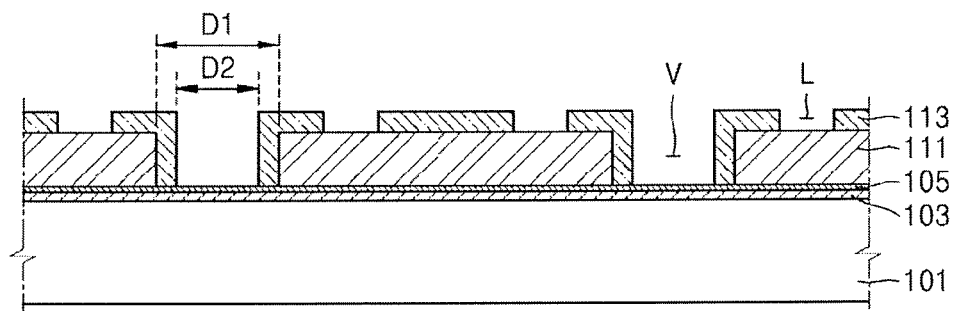

Referring to FIGS. 1C and 2E, the second photosensitive pattern layer 113 may be formed by exposure and development (S123). When the second photosensitive material layer 113*a* includes a polymeric material having negative photosensitivity, a removed portion in FIG. 2E is blocked from light during exposure process, and a remaining portion in FIG. 2E is exposed to light.

The second photosensitive pattern layer 113 may include a via hole pattern and a redistribution pattern. The above described exposure process may include exposing the second photosensitive material layer 113*a* coated structure with a negative mask containing a mask pattern for printing the via hole pattern and the redistribution pattern. The protective layer 105 may be exposed again by a recessed portion of the second photosensitive pattern layer 113. Here, for convenience, it is assumed that a region, in which the second photosensitive pattern layer 113 is removed and the first photosensitive pattern layer 111 remains, corresponds to a redistribution pattern L, and that a region, in which the protective layer 105 is exposed again, corresponds to a via hole pattern V. However, in some instances, a case that is reverse to the above case may be assumed, as needed.

An inner diameter D1 of the via hole pattern of the first photosensitive pattern layer 111 may be greater than an inner diameter D2 of the via hole pattern of the second photosensitive pattern layer 113. In addition, the via hole pattern of the second photosensitive pattern layer 113 may overlap the via hole pattern of the first photosensitive pattern layer 111.

Hardness of the first and second photosensitive pattern layers 111 and 113 may be enhanced by hard baking after forming the first photosensitive pattern layer 111 and the second photosensitive pattern layer 113.

For example, the hard baking may be performed at a temperature of about 150° C. to about 400° C. for about 1 minute to about 2 hours, without being limited thereto.

Although the first photosensitive pattern layer 111 and the second photosensitive pattern layer 113 are identified as being apart from each other in FIG. 2E, an interface between the first photosensitive pattern layer 111 and the second photosensitive pattern layer 113 may not be identified when the first and second photosensitive pattern layers 111 and 113 include the same material.

FIGS. 3A to 3D are side cross-sectional views showing another method of forming a first photosensitive pattern layer 111c and a second photosensitive pattern layer 113c according to a process order, according to an exemplary embodiment of the inventive concept.

Figure 3A:
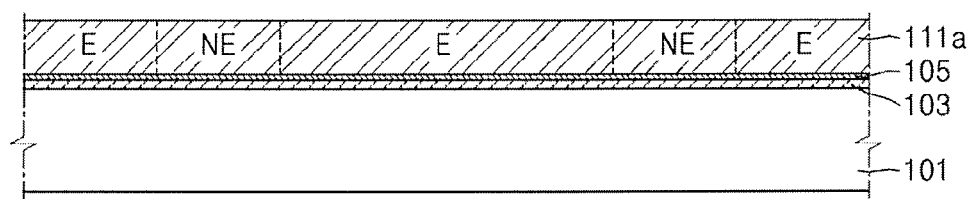
FIGS. 3A to 3D are side cross-sectional views showing another method of forming a first photosensitive pattern layer and a second photosensitive pattern layer according to a process order, according to an exemplary embodiment of the inventive concept.

Referring to FIG. 3A, as shown, a light-exposed portion and a non-light-exposed portion of the first photosensitive material layer 111a have different properties from each other through an exposure process. Portions marked by "E" in FIG. 3A represent light-exposed portions, and remain without being removed thereof even though a developer is applied thereto afterward. In addition, portions marked by "NE" in FIG. 3A represent non-light-exposed portions, and are removed when a developer is applied thereto afterward. However, the portions marked by "NE" may also be changed into remaining portions when exposed to light afterward.

Figure 3B:
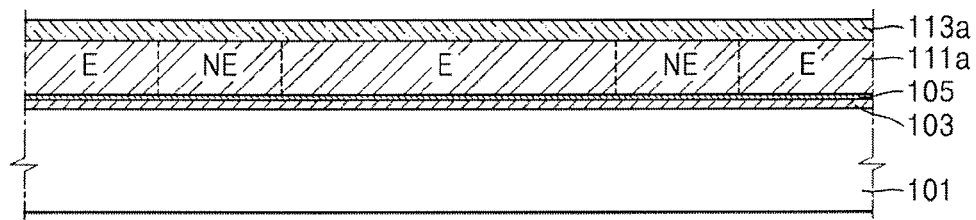

Referring to FIG. 3B, the second photosensitive material layer 113a is formed on the first photosensitive material layer 111a which has been through an exposure process. Since the second photosensitive material layer 113a has been described above, repeated descriptions thereof are omitted.

Figure 3C:
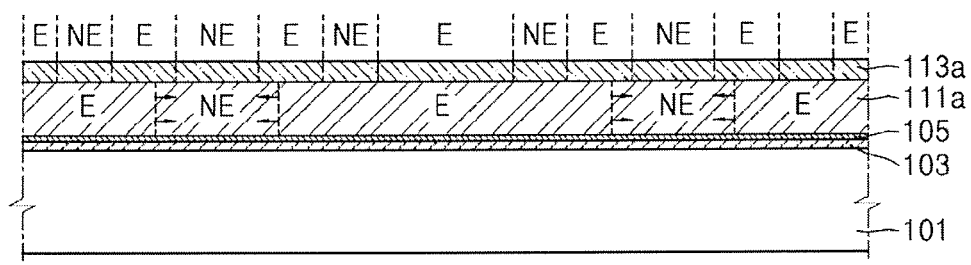

Referring to FIG. 3C, the second photosensitive material layer 113a is exposed to light. Like in FIG. 3A, portions marked by "E" in the second photosensitive material layer 113a represent light-exposed portions, and remain without being removed thereof even though a developer is applied thereto afterward. In addition, portions marked by "NE" in the second photosensitive material layer 113a represent non-light-exposed portions, and are removed when a developer is applied thereto afterward.

The first photosensitive material layer 111a may also be affected by the exposure pattern of the second photosensitive material layer 113a. That is, although the already-light-exposed portions E of the first photosensitive material layer 111a are not affected by the exposure pattern of the second photosensitive material layer 113a, light-exposed portions (regions indicated by arrows in FIG. 3C) upon light exposure of the second photosensitive material layer 113a, in the non-light-exposed portions NE of the first photosensitive material layer 111a, have properties changed by the light exposure. In other words, the regions indicated by the arrows in FIG. 3C are now light-exposed and changed into portions remaining without being affected by a developer afterward.

Figure 3D:
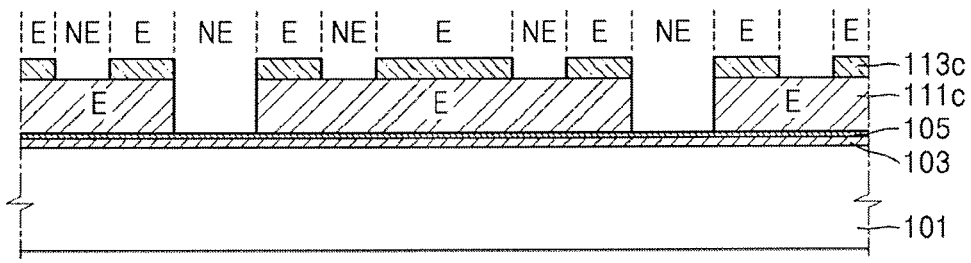

Referring to FIG. 3D, non-light-exposed portions are removed by development, thereby simultaneously forming the first photosensitive pattern layer 111c and the second photosensitive pattern layer 113c. The first photosensitive pattern layer 111c and the second photosensitive pattern layer 113c in FIG. 3D are somewhat different from the first photosensitive pattern layer 111 and the second photosensitive pattern layer 113 in FIG. 2E, respectively. However, an overall pattern of the first photosensitive pattern layer 111c and the second photosensitive pattern layer 113c in FIG. 3D is the same as an overall pattern of the first photosensitive pattern layer 111 and the second photosensitive pattern layer 113 in FIG. 2E. That is, the portions marked "NE" in both the first photosensitive pattern layer 111c and the second photosensitive pattern layer 113c in FIG. 3D may correspond to the portions marked "V" in the second photosensitive pattern layer 113 in FIG. 2E. Also, the portions marked "NE" only in the second photosensitive pattern layer 113c in FIG. 3D may correspond to the portions marked "L" in the second photosensitive pattern layer 113 in FIG. 2E.

Referring again to FIG. 1C, a conductive material may fill the insides of the via hole pattern and the redistribution pattern (S125). The filling by the conductive material may be performed in various manners, for example, by any method such as electrolytic plating, electroless plating, physical vapor deposition, chemical vapor deposition, epitaxial growth, or the like. Although an electroless plating method will be described hereinafter, the inventive concept is not limited thereto.

Figure 2F:
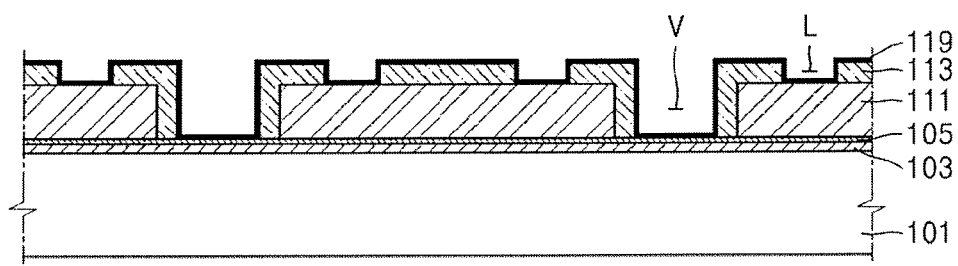

Referring to FIG. 2F, to fill the insides of the via hole pattern and the redistribution pattern with the conductive material, a seed layer 119 may be formed on all exposed surfaces of the patterns.

The seed layer 119 may include a single material layer, or include a material layer including two or more materials. In addition, the seed layer 119 may include a single layer, or include a layer in which two or more layers are stacked.

In an exemplary embodiment of the inventive concept, the seed layer 119 may include, for example, copper (Cu), titanium (Ti), titanium tungsten (TiW), titanium nitride (TiN), tantalum (Ta), tantalum nitride (TaN), chromium (Cr), aluminum (Al), or the like. However, the seed layer 119 is not limited to the materials set forth above. In an exemplary embodiment of the inventive concept, the seed layer 119 may include Cu/Ti, in which copper is stacked on titanium, or include Cu/TiW, in which copper is stacked on titanium tungsten.

The seed layer 119 may be formed by physical vapor deposition. For example, the seed layer 119 may be formed by sputtering. When the seed layer 119 is formed by sputtering, adhesion of the seed layer 119 to the first photosensitive pattern layer 111 and the second photosensitive pattern layer 113 may be enhanced, thereby enhancing the reliability of the interposer.

The seed layer 119 may cover a sidewall and a bottom surface of the redistribution pattern L and a sidewall and a bottom surface of the via hole pattern V. In addition, the seed layer 119 may cover an uppermost surface of the second photosensitive pattern layer 113.

Figure 2G:
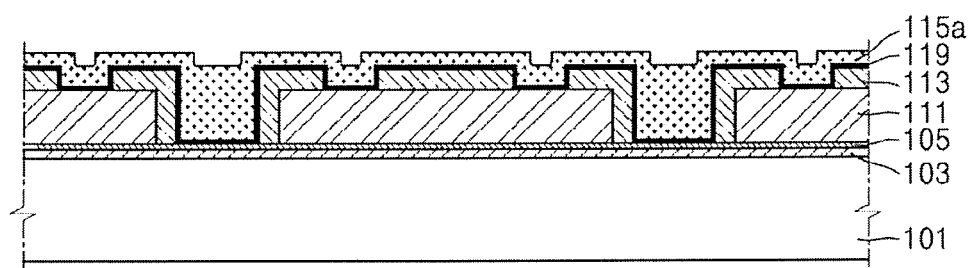

Referring to FIG. 2G, electroless plating may be performed by using the seed layer 119, thereby forming a conductive material layer 115a.

The conductive material layer 115a may include a metal such as, for example, copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or the like, or alloys thereof, without being limited thereto. When copper (Cu) is used as the conductive material layer 115a, a portion of the seed layer 119 may act as a diffusion barrier layer.

As shown in FIG. 2G, the conductive material layer 115a formed by electroless plating may have a significantly greater thickness in the via hole pattern V than in the redistribution pattern L. This may be achieved by adding an additive such as a suppressor to a plating solution. For example, the suppressor may include polyesters, polyethylene glycol, polypropylene glycol, or the like. The suppressor is adsorbed onto the top surface of the seed layer 119 or a surface inside the shallow redistribution pattern L, thereby promoting slow deposition of copper by electroless plating. On the other hand, since a concentration of the suppressor in the via hole pattern V is relatively low, reduction of a deposition rate by the suppressor in the via hole pattern V is less than that in the other regions, and thus, a plating rate in the via hole pattern V may be higher than plating rates in the other regions (that is, on the top surface of the seed layer 119, or in the redistribution pattern L).

To form the conductive material layer 115a, the plating solution may further include an additive such as, for example, a surfactant, a brightener, an accelerator, or the like.

Figure 2H:
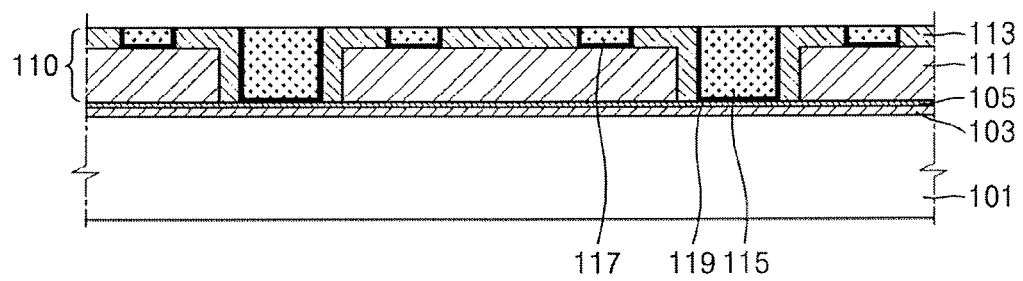

Referring to FIGS. 1C and 2H, to form a first unit redistribution layer 110, planarization may be performed on the resulting product of FIG. 2G (S127).

The planarization may be performed by a mechanical method. For example, a method such as mechanical cutting, grinding, powder blasting, or the like may be used. The planarization may be a process excluding chemical methods. In this case, the planarization method may exclude chemical mechanical polishing (CMP).

By the planarization, the conductive material layer 115a and the seed layer 119 on the top surface of the second photosensitive pattern layer 113 are removed, and the top surface of the second photosensitive pattern layer 113 may be exposed. In addition, the conductive material layer 115a, on the via hole pattern V and the redistribution pattern L, may be partially removed.

By the planarization, a conductive via plug 115 is defined by the via hole pattern V, and a conductive redistribution line 117 may be defined by the redistribution pattern L.

The first unit redistribution layer 110 may have a substantially flat top surface, as shown in FIG. 2H. In other words, as shown in FIG. 2H, a top surface of the conductive via plug 115, a top surface of the conductive redistribution line 117, and the top surface of the second photosensitive pattern layer 113 may be substantially coplanar.

To sum up the processes shown in FIGS. 2B to 2H, two photosensitive pattern layers may be formed to form a via hole pattern and a redistribution pattern, followed by filling the via hole pattern and the redistribution pattern with a conductive material, and then, a top surface of the unit redistribution layer may be planarized. These processes may be understood as one cycle for forming one unit redistribution layer (the first unit redistribution layer 110, in the present embodiment), and an interposer having two or more unit redistribution layers may be obtained by repeating the cycle. The processes may be terminated after one unit redistribution layer is formed, or the cycle may be repeated to form N unit redistribution layers, as needed, as shown in the flowchart of FIG. 1B.

FIGS. 2I to 2N are side cross-sectional views showing processes of forming a second unit redistribution layer 120 according to a process order. Since the processes shown in FIGS. 2I to 2N correspond to the repetition of the cycle shown in FIGS. 2B to 2H, repeated descriptions thereof are omitted.

Figure 2I:
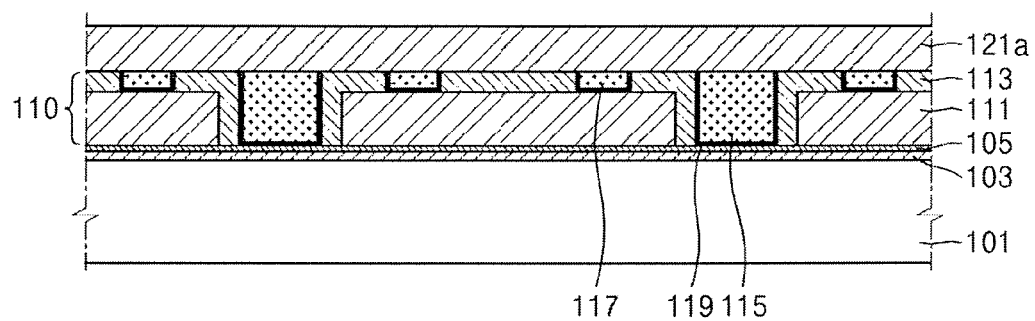

Referring to FIG. 2I, to form a third photosensitive pattern layer on the first unit redistribution layer 110, a third photosensitive material layer 121a may be formed on the first unit redistribution layer 110.

Figure 2J:
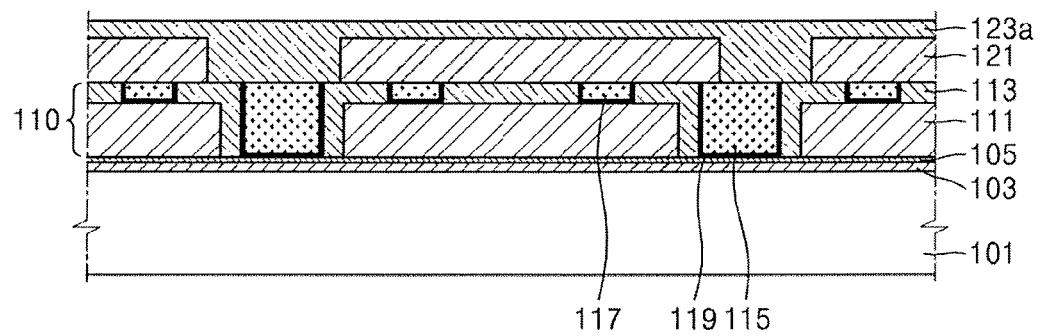

Referring to FIG. 2J, a third photosensitive pattern layer 121 may be formed by exposure and development. Like in the formation of the first unit redistribution layer 110, when the third photosensitive material layer 121a includes a polymeric material having negative photosensitivity, a light-blocked portion in FIG. 2J is removed by a developer, and a light-exposed portion in FIG. 2J remains even after the development is performed.

In an exemplary embodiment of the inventive concept, as described with reference to FIGS. 3A to 3D, after only the exposure of the third photosensitive material layer 121a is performed, the development may be performed once after exposure of a fourth photosensitive material layer 123a is also performed.

After the formation of the third photosensitive pattern layer 121, the fourth photosensitive material layer 123a is formed on the third photosensitive pattern layer 121.

Figure 2K:
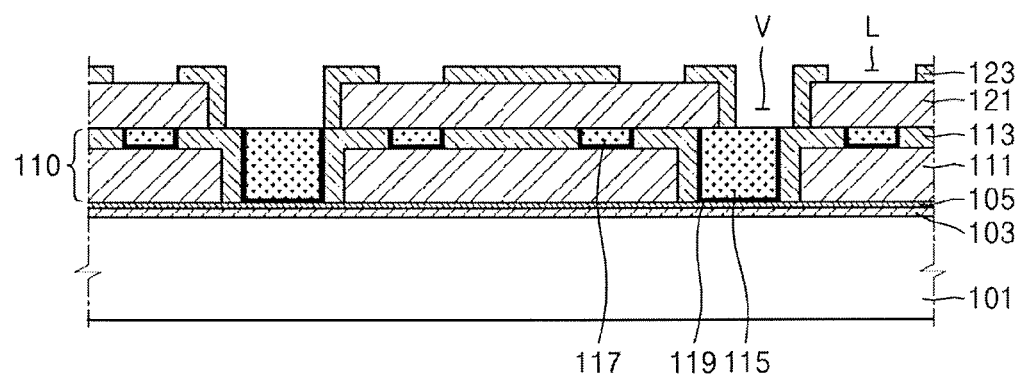

Referring to FIG. 2K, a fourth photosensitive pattern layer 123 may be formed by exposure and development. A redistribution pattern L and a via hole pattern V may be obtained by the third photosensitive pattern layer 121 and the fourth photosensitive pattern layer 123. The above described exposure process may include exposing the fourth photosensitive material layer 123a coated structure with a negative mask containing a mask pattern for printing the via hole pattern V and the redistribution pattern L. As described previously, the actual pattern in the negative mask may contain the inverse of the hole pattern V and the redistribution pattern L to be transferred.

In an operation of FIG. 2K, the via hole pattern V may totally or partially expose the conductive via plug 115 of the first unit redistribution layer 110. In addition, although the via hole pattern V is shown as not exposing the conductive redistribution line 117 of the first unit redistribution layer 110 in FIG. 2K of the present exemplary embodiment of the inventive concept, the conductive redistribution line 117 of the first unit redistribution layer 110 may be exposed by the via hole pattern V in an exemplary embodiment of the inventive concept.

Figure 2L:
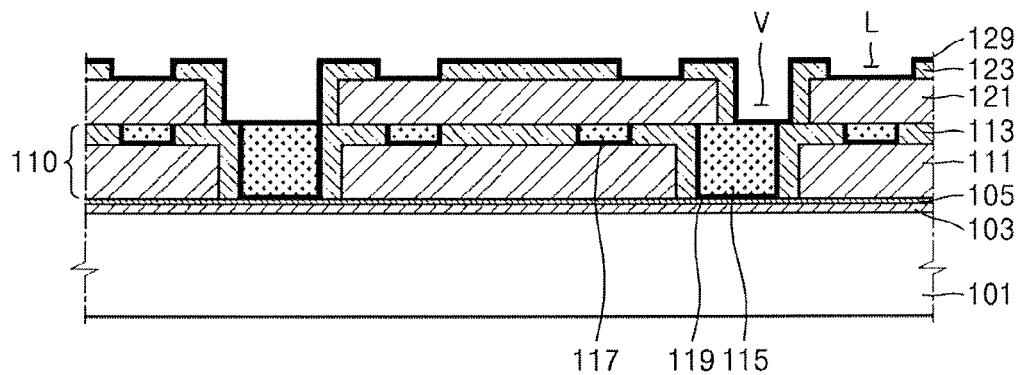

Referring to FIG. 2L, a seed layer 129 may be formed on all exposed surfaces of the patterns. The seed layer 129 may cover a sidewall and a bottom surface of the redistribution pattern L and a sidewall and a bottom surface of the via hole pattern V. In addition, the seed layer 129 may cover an uppermost surface and an exposed side surface of the fourth photosensitive pattern layer 123. The seed layer 129 may cover an exposed surface of the third photosensitive pattern layer 121.

Since a material of the seed layer 129, a method of forming the seed layer 129, and the like are the same as in the case of the seed layer 119 described with reference to FIG. 2F, repeated descriptions thereof are omitted.

Figure 2M:
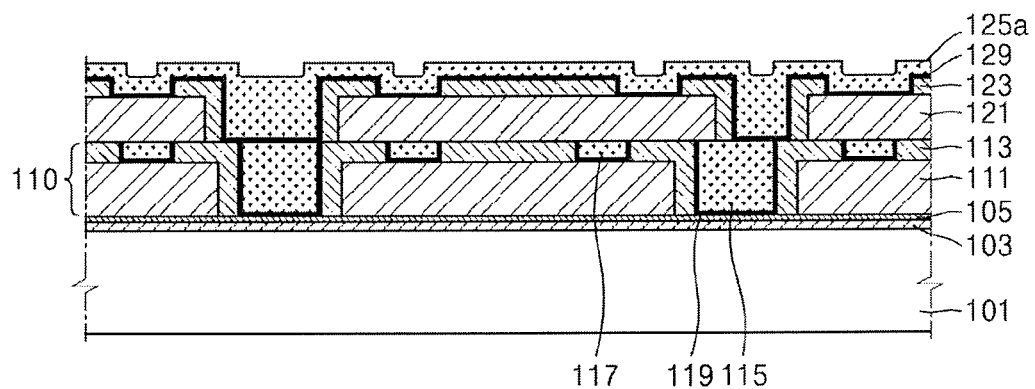

Referring to FIG. 2M, electroless plating may be performed by using the seed layer 129, thereby forming a conductive material layer 125a.

Since a material of the conductive material layer 125a, additives of a plating solution, and the like are the same as described with reference to FIG. 2G, repeated descriptions thereof are omitted.

Figure 2N:
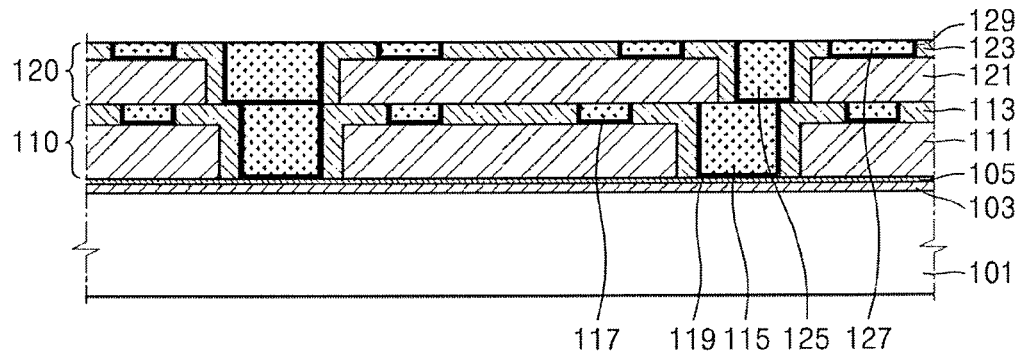

Referring to FIG. 2N, to form the second unit redistribution layer 120, planarization may be performed on the resulting product of FIG. 2M. The planarization may be performed by a mechanical method, for example, a mechanical cutting method. By the planarization, a conductive via plug 125 may be defined by the via hole pattern V, and a conductive redistribution line 127 may be defined by the redistribution pattern L in the third photosensitive pattern layer 121 and the fourth photosensitive pattern layer 123.

As shown in FIG. 2N, the second unit redistribution layer 120 may have a substantially flat top surface. In other words, as shown in FIG. 2N, a top surface of the conductive via plug 125, a top surface of the conductive redistribution line 127, and a top surface of the fourth photosensitive pattern layer 123 may be substantially coplanar.

FIGS. 2O to 2U are side cross-sectional views showing processes of forming a third unit redistribution layer 130 according to a process order. Since the processes shown in FIGS. 2O to 2U correspond to the repetition of the cycle shown in FIGS. 2B to 2H or the cycle shown in FIGS. 2I to 2N, repeated descriptions thereof are omitted.

Figure 2O:
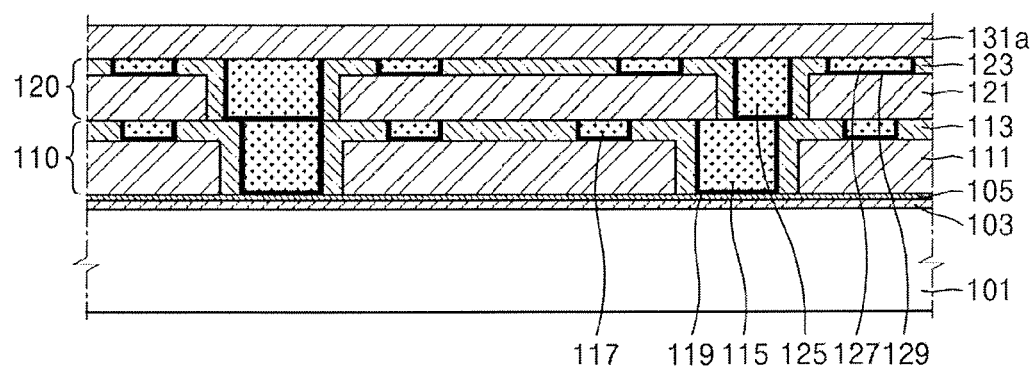

Referring to FIG. 2O, to form a fifth photosensitive pattern layer on the second unit redistribution layer 120, a fifth photosensitive material layer 131a may be formed on the second unit redistribution layer 120.

Figure 2P:
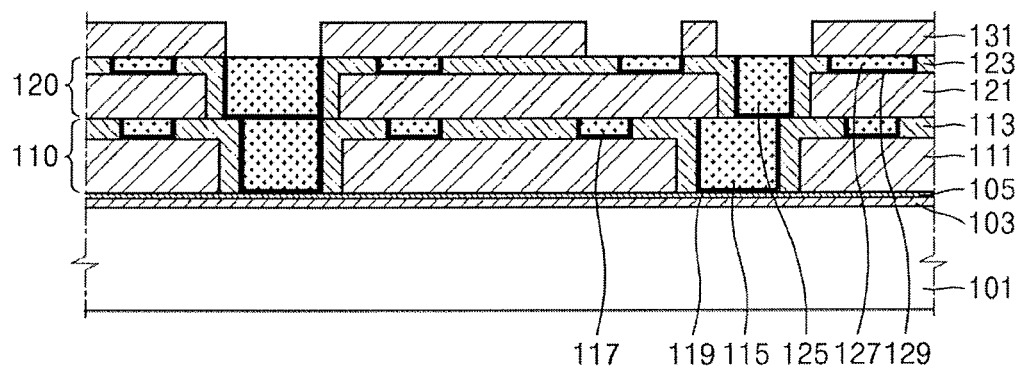

Referring to FIG. 2P, a fifth photosensitive pattern layer 131 may be formed by exposure and development. Like in the formation of the first unit redistribution layer 110 or the second unit redistribution layer 120, when the fifth photosensitive material layer 131a includes a polymeric material having negative photosensitivity, a light-blocked portion in FIG. 2P is removed by a developer, and a light-exposed portion in FIG. 2P remains even after the development is performed.

In an exemplary embodiment of the inventive concept, as described with reference to FIGS. 3A to 3D, after only the exposure of the fifth photosensitive material layer 131a is performed, the development may be performed once after exposure of a sixth photosensitive material layer 133a is also performed.

Figure 2Q:
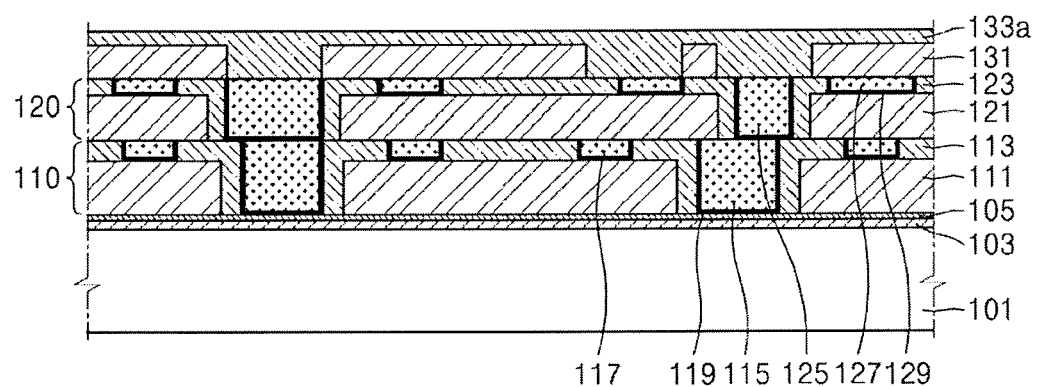

Referring to FIG. 2Q, the sixth photosensitive material layer 133a is formed on the fifth photosensitive pattern layer 131.

Figure 2R:
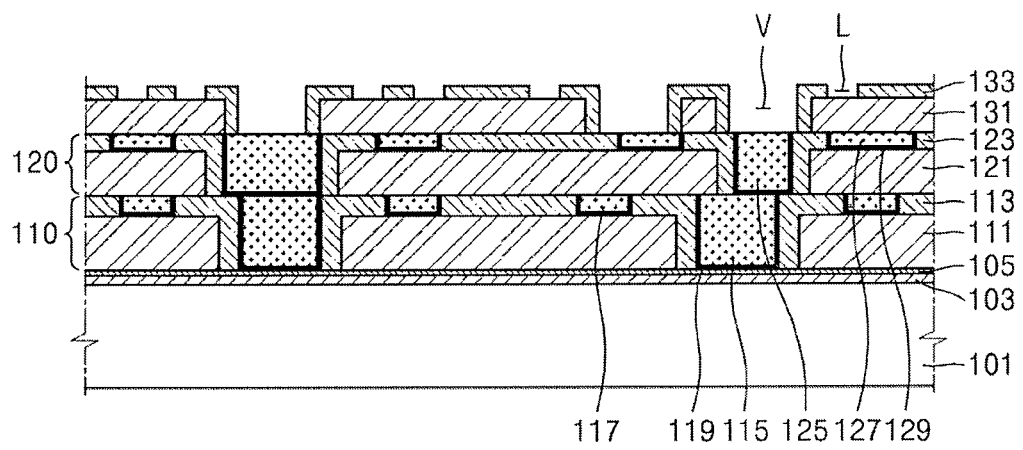

Referring to FIG. 2R, a sixth photosensitive pattern layer 133 may be formed by exposure and development. A redistribution pattern L and a via hole pattern V may be obtained by the fifth photosensitive pattern layer 131 and the sixth photosensitive pattern layer 133. The above described exposure process may include exposing the sixth photosensitive material layer 133a coated structure with a negative mask containing a mask pattern for printing the via hole pattern V and the redistribution pattern L.

In an operation of FIG. 2R, the via hole pattern V may totally or partially expose the conductive via plug 125 and/or the conductive redistribution line 127 of the second unit redistribution layer 120. In addition, although the via hole pattern V is shown as exposing the conductive via plug 125 and the conductive redistribution line 127 of the second unit redistribution layer 120 in FIG. 2R of the present exemplary embodiment of the inventive concept, only the conductive via plug 125 of the second unit redistribution layer 120 may be exposed by the via hole pattern V in an exemplary embodiment of the inventive concept.

Figure 2S:
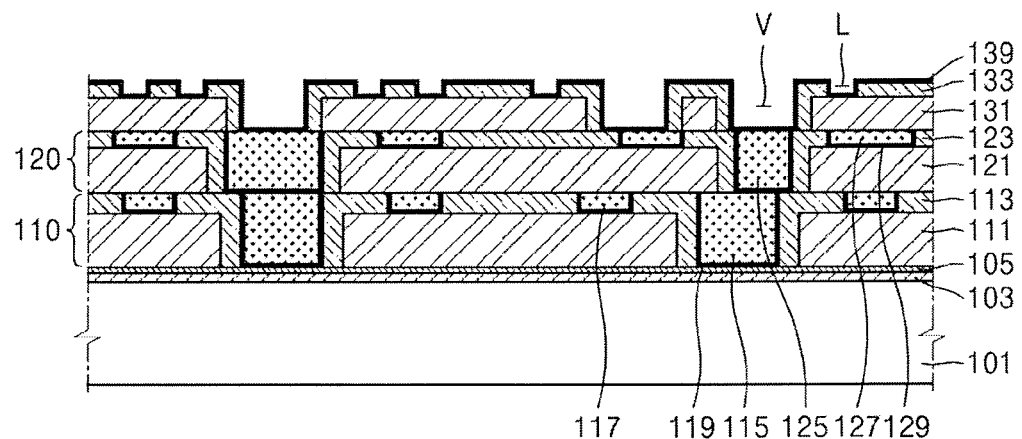

Referring to FIG. 2S, a seed layer 139 may be formed on all exposed surfaces of the patterns. The seed layer 139 may cover a sidewall and a bottom surface of the redistribution pattern L and a sidewall and a bottom surface of the via hole pattern V. In addition, the seed layer 139 may cover an uppermost surface and an exposed side surface of the sixth photosensitive pattern layer 133. The seed layer 139 may cover an exposed surface of the fifth photosensitive pattern layer 131.

Since a material of the seed layer 139, a method of forming the seed layer 139, and the like are the same as in the case of the seed layer 119 described with reference to FIG. 2F, repeated descriptions thereof are omitted.

Figure 2T:
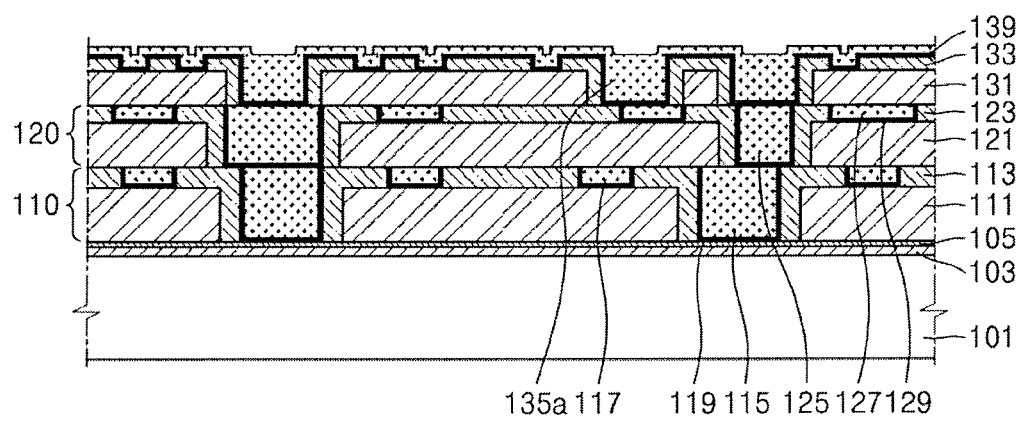

Referring to FIG. 2T, electroless plating may be performed by using the seed layer 139, thereby forming a conductive material layer 135a.

Since a material of the conductive material layer 135a, additives of a plating solution, and the like are the same as described with reference to FIG. 2G, repeated descriptions thereof are omitted.

Figure 2U:
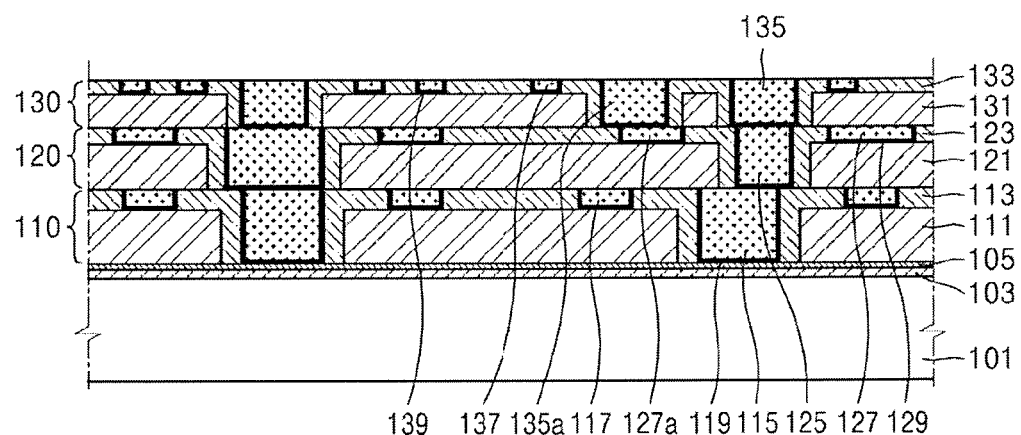

Referring to FIG. 2U, to form the third unit redistribution layer 130, planarization may be performed on the resulting product of FIG. 2T. The planarization may be performed by a mechanical method, for example, a mechanical cutting method. By the planarization, a conductive via plug 135 may be defined by the via hole pattern V, and a conductive redistribution line 137 may be defined by the redistribution pattern L in the fifth photosensitive pattern layer 131 and the sixth photosensitive pattern layer 133.

As shown in FIG. 2U, the third unit redistribution layer 130 may have a substantially flat top surface. In other words, as shown in FIG. 2U, a top surface of the conductive via plug 135, a top surface of the conductive redistribution line 137, and a top surface of the sixth photosensitive pattern layer 133 may be substantially coplanar.

Although interfaces between the first unit redistribution layer 110, the second unit redistribution layer 120, and the third unit redistribution layer 130, which have been described above, may be identified, the interfaces may not be identified depending upon materials of the photosensitive pattern layers. For example, no interfaces may be identified when the first to sixth photosensitive pattern layers 111, 113, 121, 123, 131, and 133 include the same material. Some interfaces may be identified when some of these photosensitive pattern layers include different materials.

The conductive via plugs 115, 125, and 135, which have been described above, may be electrically connected while contacting each other in a vertical direction. In particular, the seed layers 129 and 139, which may be hetero metal layers having a hetero metal or hetero metals different from a metal or metals of the conductive via plugs 115, 125, and 135, may be respectively interposed between the conductive via plugs 115, 125, and 135. Similarly, the seed layers 129 and 139 may include the hetero metal or hetero metals different from a metal or metals of the conductive redistribution lines 117, 127, and 137. Although the intervening seed layers 129 and 139 may be intactly observed when a cross-section of a product is analyzed afterward, some metal components of the seed layers 129 and 139, which overlap with components of the conductive via plugs 115, 125, and 135, may not be observed. However, if at least one metal included in the seed layers 129 and 139 is different from the components of the conductive via plugs 115, 125, and 135, profiles of the seed layers 129 and 139 may be identified when a cross-section of a product is analyzed afterward.

The conductive via plug 115, 125, or 135 of the corresponding first, second, or third unit redistribution layers 110, 120, or 130 may be connected to the conductive redistribution line 117 or 127 of another unit redistribution layer. As shown in FIG. 2U, a conductive via plug 135a of the third unit redistribution layer 130 may be connected to a conductive redistribution line 127a of the second unit redistribution layer 120 located thereunder.

The seed layer 139 may be between the conductive via plug 135a of the third unit redistribution layer 130 and the conductive redistribution line 127a of the second unit redistribution layer 120 located thereunder.

Figure 4:
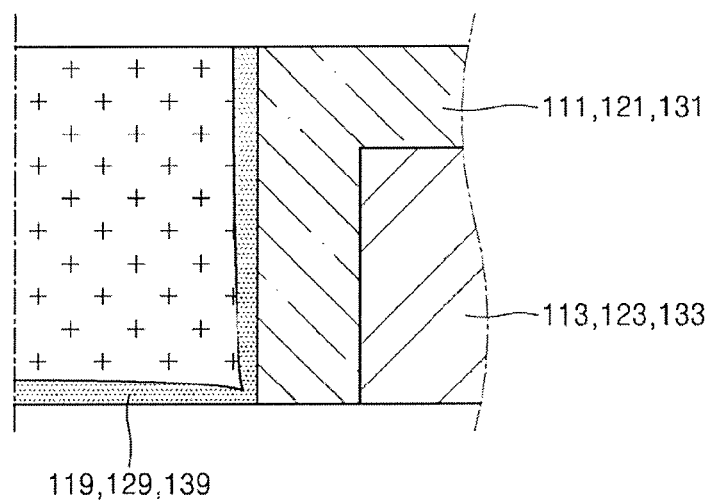
FIG. 4 is a partially enlarged view showing conductive via plugs of respective unit redistribution layers in more detail according to an exemplary embodiment of the inventive concept.

FIG. 4 is a partially enlarged view showing any of the conductive via plugs 115, 125, and 135 of the respective first, second, and third unit redistribution layers 110, 120, and 130 in more detail. Referring to FIG. 4, the conductive via plugs 115, 125, and 135 respectively have the seed layers 119, 129, and 139 on the bottom surfaces and the sidewalls thereof. The thicknesses of the seed layers 119, 129, and 139 on the sidewalls of the conductive via plugs 115, 125, and 135 may respectively increase away from the bottom surfaces of the conductive via plugs 115, 125, and 135. Similarly, the thicknesses of the seed layers 119, 129, and 139 on the sidewalls of the conductive redistribution lines 117, 127, and 137 may respectively increase away from the bottom surfaces of the conductive redistribution lines 117, 127, and 137.

Figure 2V:
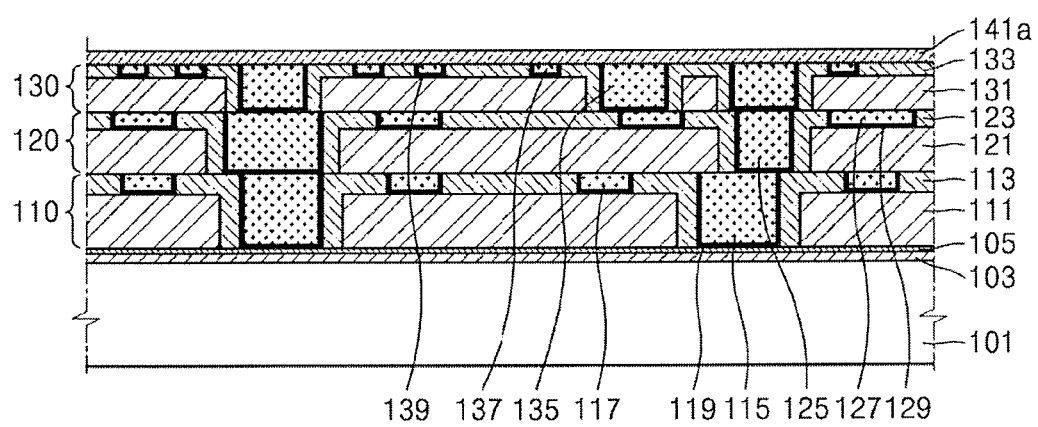

Referring to FIG. 2V, an insulating material layer 141a may be formed on the planarized top surface of the third unit redistribution layer 130. The insulating material layer 141a may include a photosensitive polymeric material, for example, PSPI. The insulating material layer 141a may be formed by a method such as spin coating and soft baking.

Since the top surface of the third unit redistribution layer 130 is substantially flat, the insulating material layer 141a may also have a substantially flat top surface.

Figure 2W:
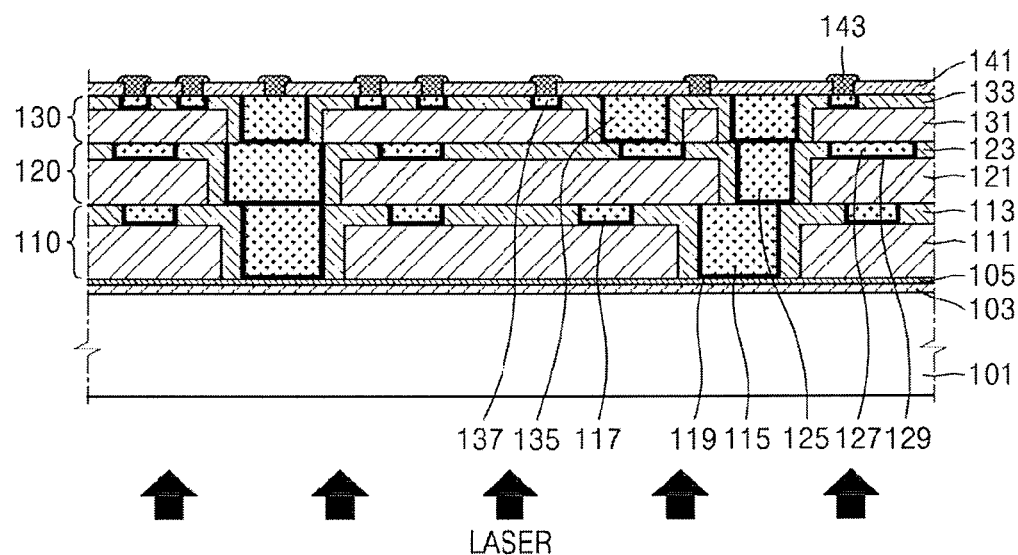
Figure 2X:
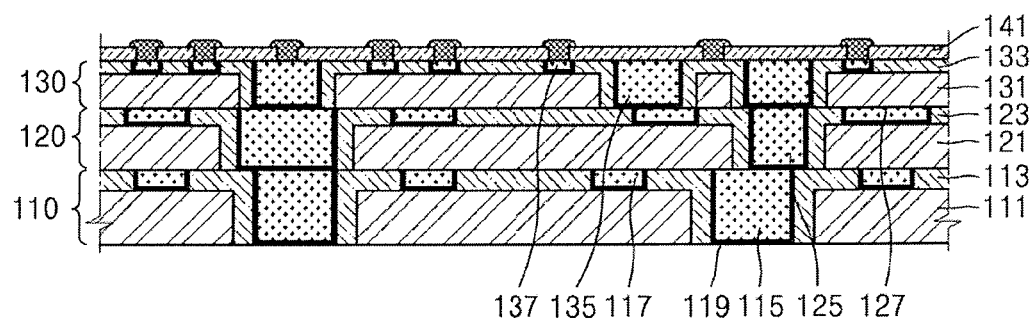

Referring to FIG. 2W, to obtain an insulating pattern 141 exposing the conductive via plug 135 and the conductive redistribution line 137, the insulating material layer 141a may be patterned. The patterning of the insulating material layer 141a may be performed by exposure and development. As described above, when the insulating material layer 141a includes a polymeric material having negative photosensitivity, a mask used for the exposure may be configured to block a portion of the insulating material layer 141a to be removed by development from light. Thus, the mask used in the exposure is a negative mask.

After the light-exposed insulating material layer 141a is developed by a developer, conductive terminals 143 may then be formed. The conductive terminals 143 may be electrically connected to the conductive via plug 135 and the conductive redistribution line 137, which are exposed after developing the light-exposed insulating material layer 141a.

The conductive terminals 143 may be formed by formation of a seed layer and electroless plating, without being limited thereto.

To separate and remove the carrier substrate 101, the carrier substrate 101 may be subjected to laser irradiation. Binding force between the laser reactive layer 103 and the carrier substrate 101 may be weakened by the laser irradiation, thereby causing the separation of the carrier substrate 101 from an interposer structure, in which the separated interposer structure may contain some remaining laser reactive layer 103 and the protective layer 105. In an exemplary embodiment of the inventive concept, the laser reactive layer 103 may be removed by the laser irradiation.

Referring to FIG. 2X, the remaining laser reactive layer 103 and the protective layer 105 may be removed by using an etchant. The removal of the remaining laser reactive layer 103 and the protective layer 105 may be performed by wet etching or dry etching.

A final interposer 100 may be obtained by removing the remaining laser reactive layer 103 and the protective layer 105.

Figure 5:
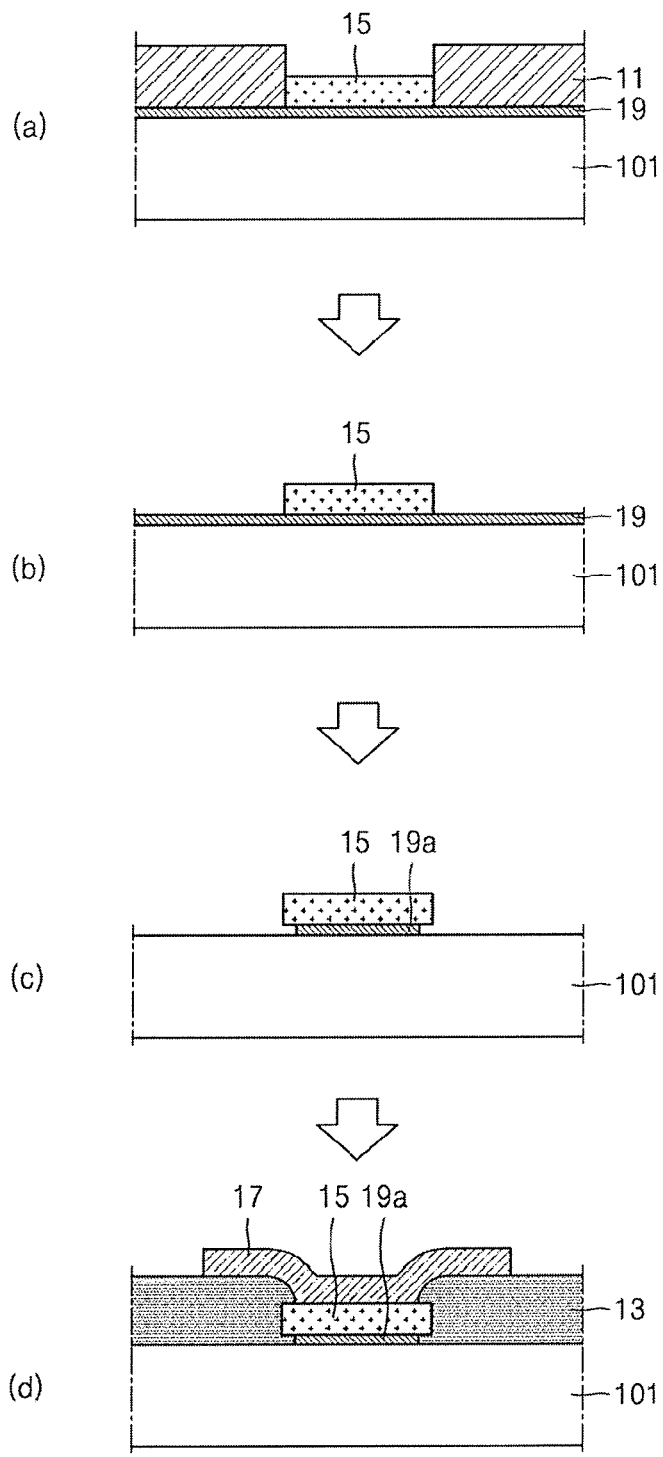
FIG. 5 is a schematic diagram showing a method of fabricating an interposer, according to a general technique, according to an exemplary embodiment of the inventive concept.
Figure 6:
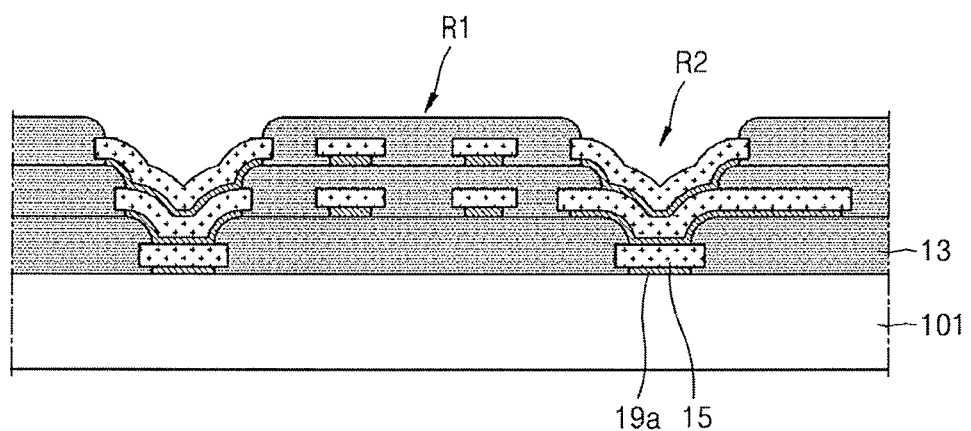
FIG. 6 is a side cross-sectional view of an interposer fabricated according to the general technique.

FIG. 5 is a schematic diagram showing a method of fabricating an interposer, according to a general technique. FIG. 6 is a side cross-sectional view of an interposer fabricated according to the general technique.

Referring to FIG. 5, a seed layer 19 may be formed first on the carrier substrate 101, followed by forming a photosensitive material layer, and then, a photosensitive pattern 11 may be formed by applying a photolithography process on the photosensitive material layer such that a region of the photosensitive pattern 11, in which a conductive pad is intended to be formed, is exposed.

A conductive pad 15 may be formed in the exposed region of the photosensitive pattern 11 by a method such as plating (a), for example, electroless plating. Although an example, in which the conductive pad 15 is formed, is described here, it will be understood by those of ordinary skill in the art that a redistribution pattern may be formed instead of the conductive pad 15.

After forming the conductive pad 15, the photosensitive pattern 11 may be removed (b), and an exposed portion of the seed layer 19 may be removed by wet etching (c). Here, in the wet etching, slightly over-etching may be performed to completely remove the exposed portion of the seed layer 19. As a result, a seed layer 19a having an undercut is obtained under the conductive pad 15.

Such an undercut as described above may weaken adhesion between the conductive pad 15 and the carrier substrate 101, and may cause the conductive pad 15 to shift or collapse when an interlayer dielectric 13 is formed by a method such as spin coating, which will be described below. In addition, as patterns become finer, bubbles may be generated between adjacent conductive pads 15 upon spin coating.

After etching the seed layer 19, the interlayer dielectric 13 may be formed such that a top surface of the conductive pattern 15 is at least partially exposed, and an additional conductive pattern 17 or redistribution pattern may be formed on the conductive pad 15 and/or the interlayer dielectric 13 by repeating the processes set forth above. The interlayer dielectric 13 has a step difference generated in a portion thereof, which corresponds to an exposed portion of the top surface of the conductive pattern 15. Thus, a top surface of the conductive pattern 17 also has a step difference.

When interlayer dielectrics and conductive patterns are formed in a multilayer structure by repeating such processes, it can be seen that unevenness of a formed conductive pad becomes severe along with the repetition of stacking the layers, as shown in FIG. 6.

If the unevenness of a top surface of a layer including the conductive pad becomes severe, focusing may not be properly performed when a material layer on the layer is patterned, thus an inaccurate pattern may be formed. In particular, since, in a lot of cases, denser micropatterns are formed away from a carrier substrate, the accuracy of the micropatterns may be deteriorated.

In the interposer 100 fabricated by the fabrication method shown in FIGS. 2A to 2X, since the first photosensitive pattern layer 111 and the second photosensitive pattern layer 113, which correspond to the interlayer dielectric 13 of FIG. 6, are formed first, followed by forming the seed layers 119, 129, and 139, the conductive via plugs 115, 125, and 135, and the conductive redistribution lines 117, 127, and 137, no undercut occurs under these conductive structures, and there is no concern that there are bubbles between these structures.

Since the top surface of the first unit redistribution layer 110 is planarized before the formation of the second unit redistribution layer 120, and the top surface of the second unit redistribution layer 120 is planarized before the formation of the third unit redistribution layer 130, surface unevenness is not transferred to another unit redistribution layer formed next. Therefore, since accurate exposure can be performed upon the formation of the subsequent unit redistribution layer, more accurate patterning can be achieved.

FIGS. 7A to 7F are side cross-sectional views showing a method of fabricating a semiconductor package according to a process order, according to an exemplary embodiment of the inventive concept.

Figure 7A:
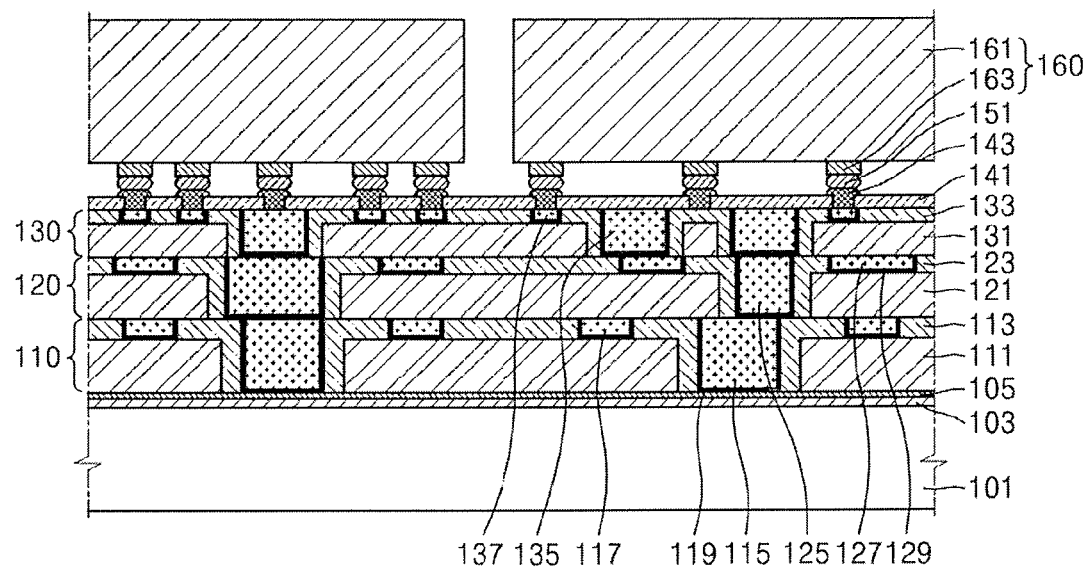
FIGS. 7A to 7F are side cross-sectional views showing a method of fabricating a semiconductor package according to a process order, according to an exemplary embodiment of the inventive concept.

Referring to FIG. 7A, since it may be more convenient to handle the interposer 100 with the carrier substrate 101 bonded thereto than to handle the interposer 100 without the carrier substrate 101, the carrier substrate 101 is shown as being present in FIG. 7A.

Semiconductor devices 160 may be attached onto the conductive terminals 143. Each of the semiconductor devices 160 may include a body 161 and conductive terminals 163. The body 161 may be a semiconductor die individualized by dicing, or may be a sub-package, in which a semiconductor die is molded. The conductive terminals 163 may be conductive pads, which may be connected to devices external to the semiconductor devices 160 by connection means such as solder bumps.

The conductive terminals 163 may be connected to the conductive terminals 143, for example, via solder bumps 151. Each of the solder bumps 151 may include a tin-based solder material including a SnAg alloy.

Figure 7B:
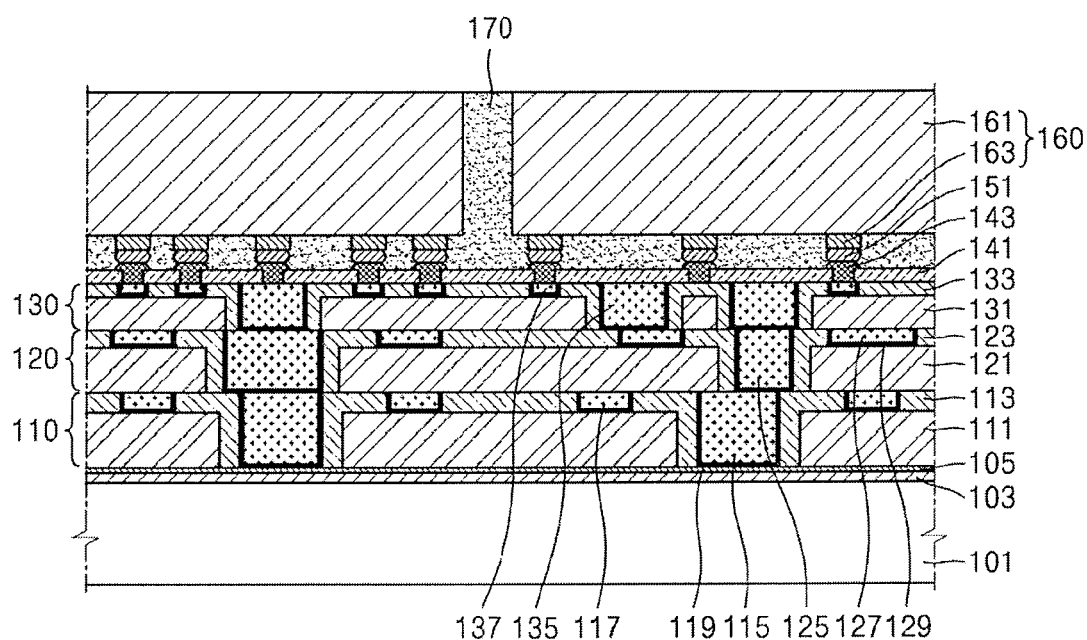

Referring to FIG. 7B, the semiconductor devices 160 may be molded and encapsulated. A molding member 170 for molding the semiconductor devices 160 may include, for example, an epoxy molding compound (EMC). The molding member 170 may cover up to top surfaces of the semiconductor devices 160, or cover only side surfaces and bottom surfaces of the semiconductor devices 160 for a more compact configuration, as shown in FIG. 7B.

Although the molding member 170 is shown as filling a space under each of the semiconductor devices 160 in FIG. 7B, the space under each of the semiconductor devices 160 may be filled with an underfill or a non-conductive film (NCF).

Figure 7C:
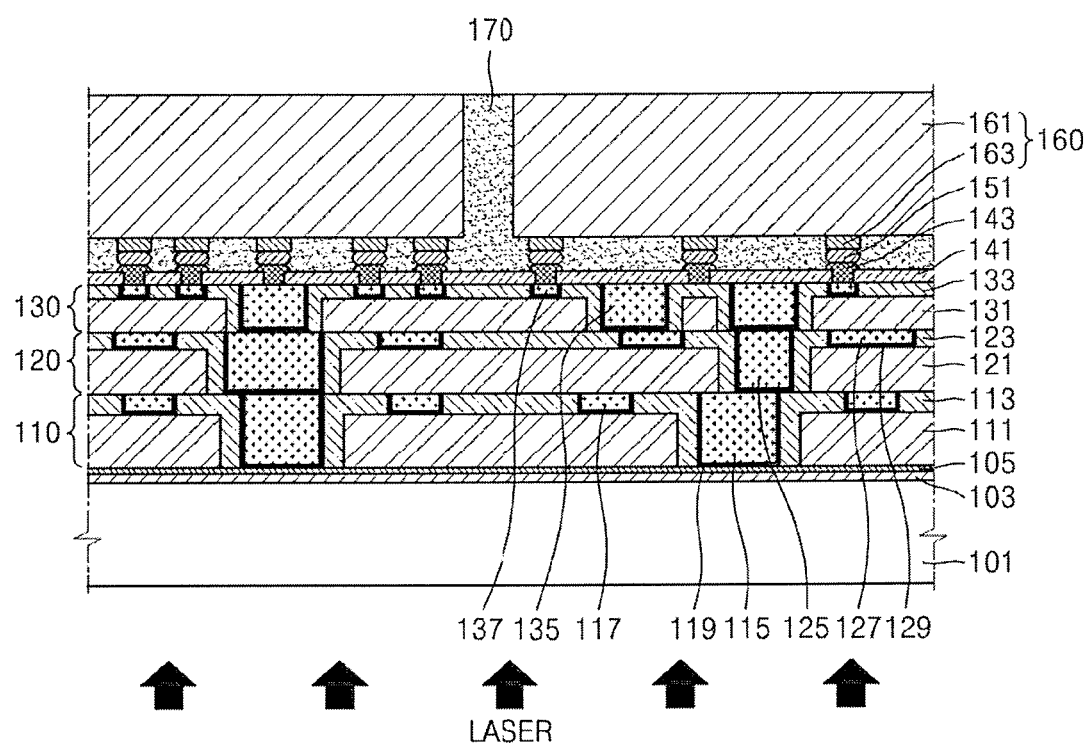

Referring to FIG. 7C, to remove the carrier substrate 101, laser irradiation may be performed. Binding force between the laser reactive layer 103 and the carrier substrate 101 may be weakened by the laser irradiation, thereby causing the separation of the carrier substrate 101 from an interposer structure, in which the separated interposer structure may contain some remaining laser reactive layer 103 and the protective layer 105. In an exemplary embodiment of the inventive concept, the laser reactive layer 103 may be removed by the laser irradiation.

Figure 7D:
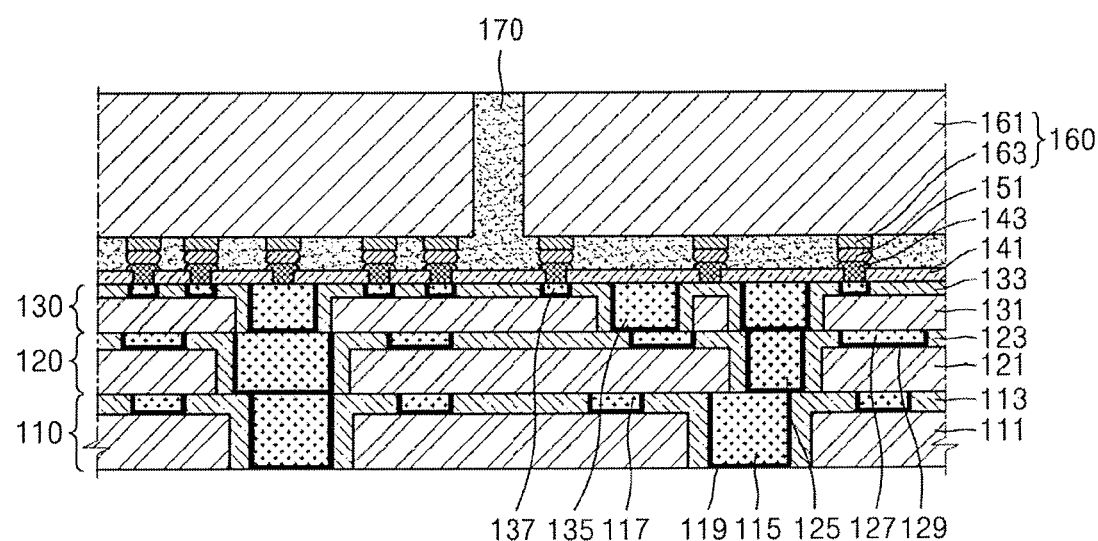

Referring to FIG. 7D, the remaining laser reactive layer 103 and the protective layer 105 may be removed by using an etchant. The removal of the remaining laser reactive layer 103 and the protective layer 105 may be performed by wet etching or dry etching.

Figure 7E:
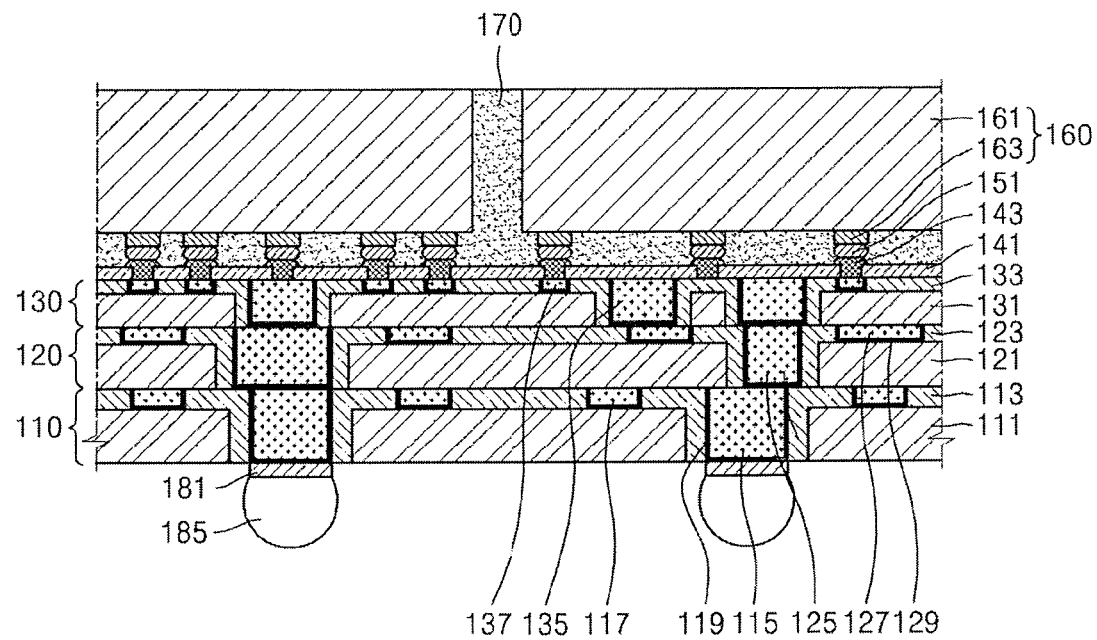

Referring to FIG. 7E, a bump pad 181 may be provided on a first conductive via plug 115 exposed after the removal of the carrier substrate 101, the laser reactive layer 103, and the protective layer 105. The seed layer 119 may remain between the first conductive via plug 115 and the bump pad 181. In an exemplary embodiment of the inventive concept, the seed layer 119 at a bottom surface side of the interposer 100 may be removed together with the protective layer 105 in a process of removing the protective layer 105.

The bump pad 181 may be a bump pad in which two or more layers are stacked, for example, a bump pad in which a wetting layer, an oxidation preventive layer, a barrier layer, and the like are stacked on a metal pad, as needed. The bump pad 181 may be formed by a method such as, for example, chemical vapor deposition, physical vapor deposition, or combinations thereof.

After the bump pad 181 is provided on the first conductive via plug 115, a connection terminal 185 may be provided on the bump pad 181. The connection terminal 185 may be, for example, a solder bump. The solder bump may be obtained by the following processes: forming a photosensitive polymer pattern; forming a solder bump pattern by plating; removing the photosensitive polymer pattern; and reflowing the solder bump pattern.

Figure 7F:
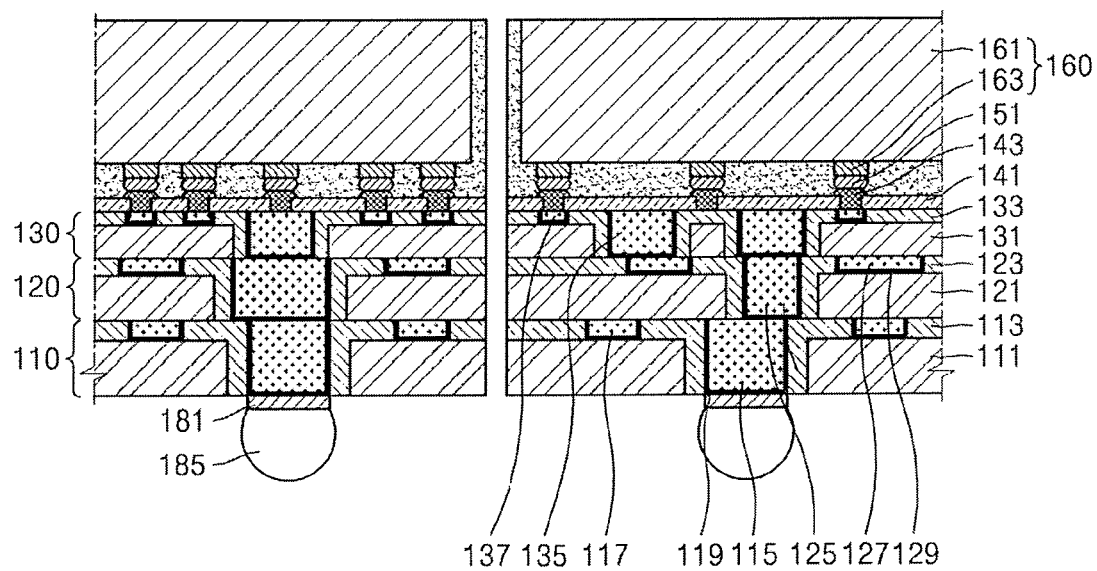

Referring to FIG. 7F, the semiconductor devices 160 may be individualized into respective semiconductor devices. For example, the individualization of the semiconductor devices 160 may be performed by a sawing process.

Figure 8A:
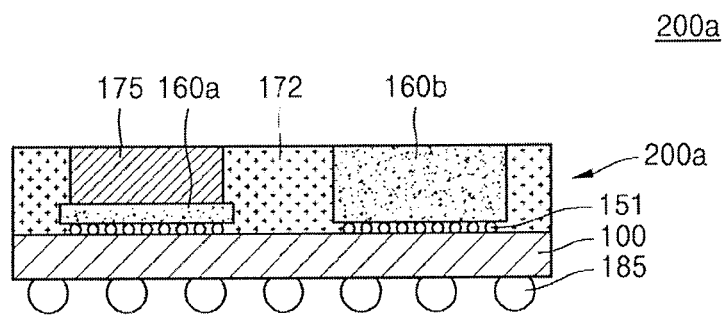
FIGS. 8A and 8B are schematic diagrams showing semiconductor packages according to an exemplary embodiment of the inventive concept.
Figure 8B:
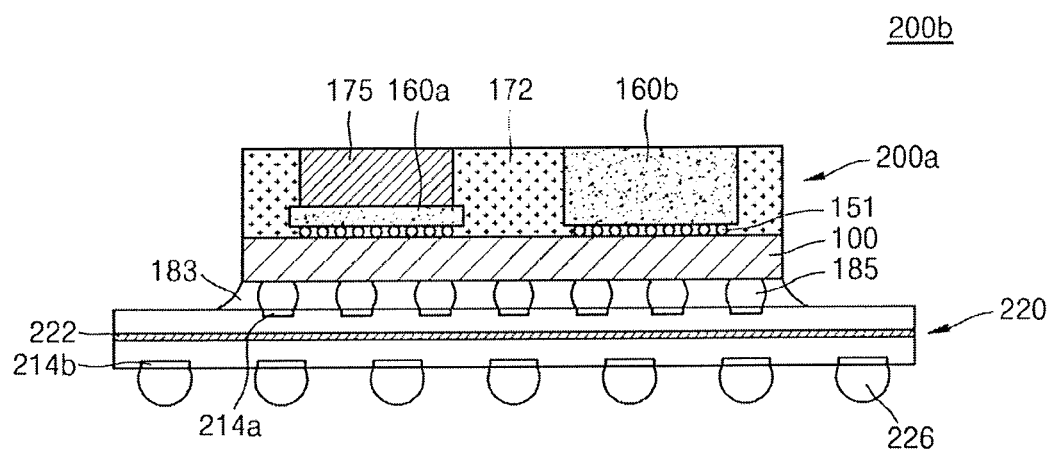

FIGS. 8A and 8B are schematic diagrams showing semiconductor packages 200*a* and 200*b* according to an exemplary embodiment of the inventive concept.

Referring to FIG. 8A, a first semiconductor device 160*a* and a second semiconductor device 160*b* may be mounted on the interposer 100, which has been described with reference to FIGS. 2A to 2X, in a horizontal direction. The first semiconductor device 160*a* and/or the second semiconductor device 160*b* may be directly mounted on the interposer 100 via micro-bumps 151.

The first semiconductor device 160*a* may be a processor unit. For example, the first semiconductor device 160*a* may be a microprocessor unit (MPU) or a graphic processor unit (GPU). In an exemplary embodiment of the inventive concept, the first semiconductor device 160*a* may be a normal-operation-verified package, that is, a known good package (KGP).

The second semiconductor device 160*b* may include a plurality of semiconductor chips sequentially stacked on a sub-package substrate. The plurality of semiconductor chips may be stacked in a vertical direction in FIG. 8A. The plurality of semiconductor chips may include 2 to 16 semiconductor chips.

The second semiconductor device 160*b* may include through silicon via (TSV) structures, and the plurality of semiconductor chips may be electrically connected to each other via the TSV structures. Further, the plurality of semiconductor chips may be electrically connected to the sub-package substrate via the TSV structures. For example, the sub-package substrate may be a printed circuit board, a ceramic substrate, or an interposer.

The second semiconductor device 160*b* may include a semiconductor memory device. For example, the memory device may include a high bandwidth memory (I-IBM). In an exemplary embodiment of the inventive concept, the memory device may include a non-volatile memory device. The non-volatile memory device may be, for example, phase-change random access memory (PRAM), magnetoresistive random access memory (MRAM), ferroelectric random access memory (FeRAM), or resistive random access memory (RRAM), without being limited thereto. In an exemplary embodiment of the inventive concept, the memory device may include a volatile memory device such as general dynamic random access memory (DRAM) or static random access memory (SRAM). In an exemplary embodiment of the inventive concept, the second semiconductor device 160*b* may include a logic chip and two or more DRAM semiconductor memory chips stacked on the logic chip.

The first semiconductor device 160*a* may generate considerable heat when operated. To facilitate the removal of heat generated by the first semiconductor device 160*a*, a heat dissipating member 175 may be provided on the first semiconductor device 160*a*. For example, the heat dissipating member 175 may be a heat sink, a heat spreader, a heat pipe, or a liquid-cooled cold plate.

The heat dissipating member 175 may be coupled to the first semiconductor device 160*a* by a heat transferring material. The heat transferring material may include an insulating material, or include a material capable of maintaining electrical insulating properties by including an insulating material. For example, the heat transferring material may include an epoxy resin. For example, the heat transferring material may be mineral oil, grease, gap filler putty, phase-change gel, a phase-change mineral pad, or a particle-filled epoxy.

The first semiconductor device 160a and the second semiconductor device 160b may be encapsulated by a molding member 172. The molding member 172 may expose top surfaces of the heat dissipating member 175 and the second semiconductor device 160b.

In an exemplary embodiment of the inventive concept shown in FIG. 8A, the interposer 100 itself may be used as a package substrate. Thus, the package substrate functions as an interposer. When the interposer 100 includes a small number of unit redistribution layers, the interposer 100 may be flexible and may be applied to various electronic products requiring flexibility.

Referring to FIG. 8B, a semiconductor package 200b may be obtained by mounting the semiconductor package 200a on a package substrate 220.

The package substrate 220 may be, for example, a printed circuit board, a ceramic substrate, or an interposer. When the package substrate 220 is a printed circuit board, the package substrate 220 may include a substrate base 222, and a top side pad 214a and a bottom side pad 214b respectively formed on a top surface and a bottom surface of the substrate base 222. The top side pad 214a and the bottom side pad 214b may be respectively exposed by solder resist layers covering the top surface and the bottom surface of the substrate base 222. The substrate base 222 may include at least one material of phenol resins, epoxy resins, and polyimide. For example, the substrate base 222 may include at least one material of FR4, tetrafunctional epoxies, polyphenylene ether, epoxy/polyphenylene oxide, bismaleimide triazine (BT), Thermount, cyanate esters, polyimides, and liquid crystalline polymers. Each of the top side pad 214a and the bottom side pad 214b may include, for example, copper, nickel, stainless steel, or beryllium copper. An internal wire may be formed inside the substrate base 222, in which the internal wire may electrically connect the top side pad 214a to the bottom side pad 214b. The top side pad 214a and the bottom side pad 214b may be respectively portions of circuit wires, which are exposed by the solder resist layers, and the circuit wires may be respectively obtained by coating Cu foil on the top surface and the bottom surface of the substrate base 222, followed by patterning the Cu foil.

When the package substrate 220 is an interposer, the package substrate 220 may be the interposer described with reference to FIGS. 2A to 2X. Optionally, the package substrate 220 may include a substrate base including a semiconductor material, and the top side pad 214a and the bottom side pad 214b respectively formed on a top surface and a bottom surface of the substrate base. For example, the substrate base may be formed from a silicon wafer. In addition, an internal wire may be formed on the top or bottom surface of the substrate base or inside the substrate base. Further, a through-via may be formed inside the substrate base, in which the through-via may electrically connect the top side pad 214a to the bottom side pad 214b.

An external connection terminal 226 may be attached onto a bottom surface of the package substrate 220. For example, the external connection terminal 226 may be attached onto the bottom side pad 214b. For example, the external connection terminal 226 may be a solder ball or bump. The external connection terminal 226 may electrically connect the semiconductor package 200b to a device external to the semiconductor package 200b.

As described above, according to the inventive concept, since the first photosensitive pattern layer and the second photosensitive pattern layer are formed first, followed by forming the seed layers, the conductive via plugs, and the conductive redistribution lines, no undercut occurs under these conductive structures. In addition, since the seed layer extends up to a sidewall of a conductive structure as well as on a bottom surface of the conductive structure, a concern of causing damage to the conductive structure is reduced. Further, there is no concern that there are bubbles between adjacent conductive via plugs or conductive redistribution lines. Furthermore, since the top surface of the unit redistribution layer is flat and thus optically stable for accurate exposure in the formation of the subsequent unit redistribution layer, more accurate patterning can be achieved.

Figure 9:
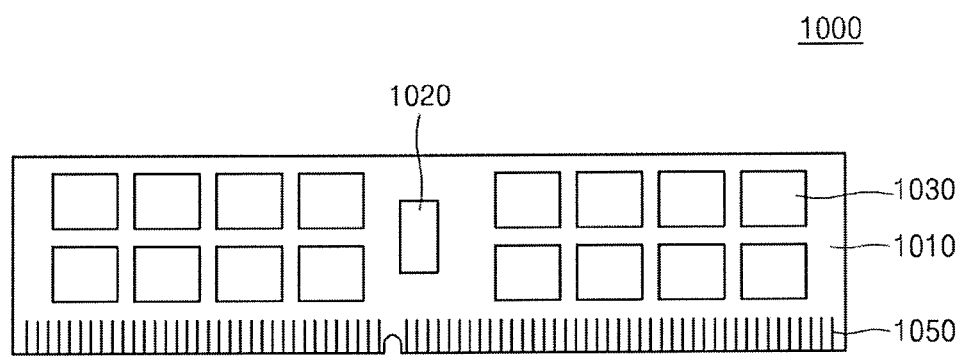
FIG. 9 is a plan view showing main components of a semiconductor module according to an exemplary embodiment of the inventive concept.

FIG. 9 is a plan view showing main components of a semiconductor module according to an exemplary embodiment of the inventive concept.

Referring to FIG. 9, a semiconductor module 1000 includes a module substrate 1010, a control chip 1020, and a plurality of semiconductor packages 1030, in which the control chip 1020 and the plurality of semiconductor packages 1030 are mounted on the module substrate 1010.

Each of the plurality of semiconductor packages 1030 may include the interposer 100 described with reference to FIGS. 2A to 2X.

Figure 10:
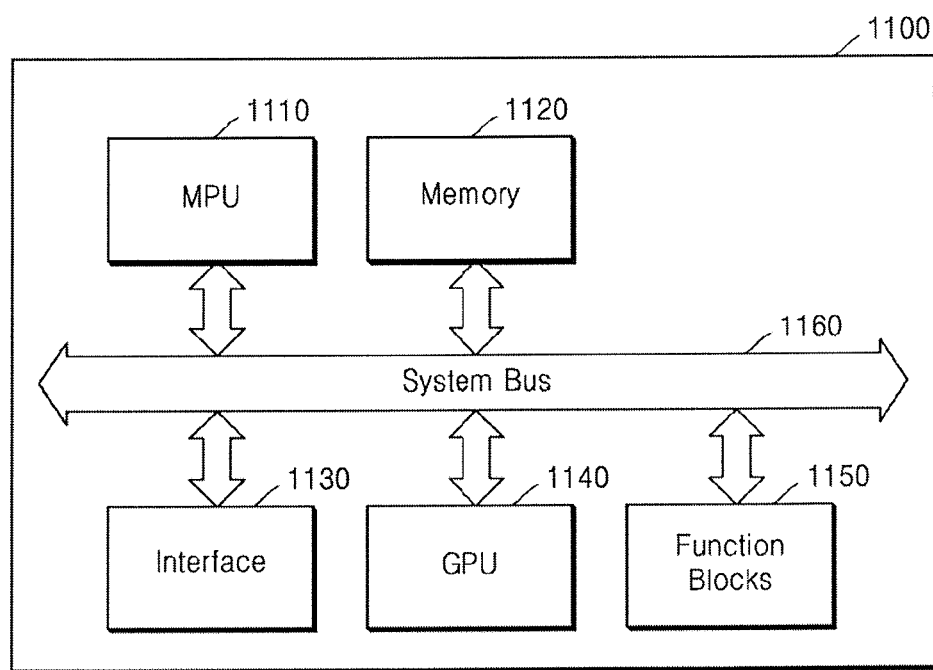
FIG. 10 is a schematic diagram showing components of a semiconductor package according to an exemplary embodiment of the inventive concept.

FIG. 10 is a schematic diagram showing components of a semiconductor package according to an exemplary embodiment of the inventive concept.

Referring to FIG. 10, a semiconductor package 1100 may include a microprocessing unit 1110, a memory 1120, an interface 1130, a graphics processing unit 1140, function blocks 1150, and a bus 1160 connecting these components to each other. The semiconductor package 1100 may include both of the microprocessing unit 1110 and the graphics processing unit 1140, or include only one thereof.

The microprocessing unit 1110 may include a core and an L2 cache. For example, the microprocessing unit 1110 may include multiple cores. The performances of the respective cores may be the same or different. In addition, the respective cores may be activated simultaneously or at different times. The memory 1120 may store results processed by the function blocks 1150, and the like, under the control of the microprocessing unit 1110. For example, as contents stored in the L2 cache are flushed, the microprocessing unit 1110 may make the contents be stored in the memory 1120. The interface 1130 may interface the semiconductor package 1100 with devices external to the semiconductor package 1100. For example, the interface 1130 may interface the semiconductor package 1100 with a camera, a liquid crystal display (LCD), a speaker, or the like.

The graphics processing unit 1140 may perform graphic functions. For example, the graphics processing unit 1140 may perform video codec functions, or may process three-dimensional (3D) graphics.

The function blocks 1150 may perform various functions. For example, when the semiconductor package 1100 is an application processor (AP) used in a mobile device, some of the function blocks 1150 may perform communication functions.

The semiconductor package 1100 may include the interposer 100 described with reference to FIGS. 2A to 2X.

Figure 11:
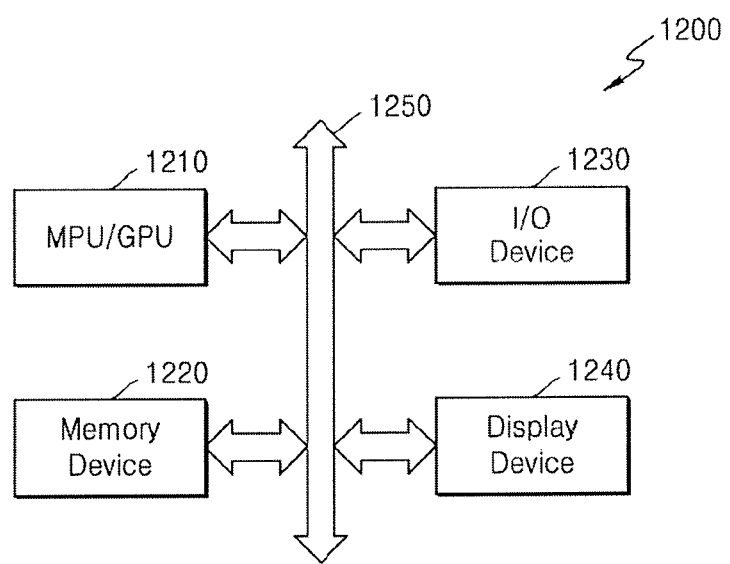
FIG. 11 is a diagram showing an electronic system including a semiconductor package according to an exemplary embodiment of the inventive concept.

FIG. 11 is a diagram showing an electronic system including a semiconductor package according to an exemplary embodiment of the inventive concept.

Referring to FIG. 11, an MPU/GPU 1210 may be mounted in an electronic system 1200. For example, the electronic system 1200 may be a mobile device, a desktop computer, or a server. In addition, the electronic system 1200 may further include a memory device 1220, an input/output device 1230, and a display device 1240, and each of these components may be electrically connected to a bus 1250. Each of the MPU/GPU 1210 and the memory device 1220 may include the interposer 100 described with reference to FIGS. 2A to 2X.

While the inventive concept has been particularly shown and described with reference to specific exemplary embodiments of the inventive concept thereof, it will be understood that various changes in form and details may be made therein without departing from the spirit and scope of the following claims.

What is claimed is:

1. A semiconductor package comprising:
    a plurality of unit redistribution layers stacked vertically on top of each other, each of the plurality of unit redistribution layers comprising:
        a first polymer layer having a first via hole pattern;
        a second polymer layer formed on sidewall and upper surface of the first polymer layer, and having a redistribution pattern on the first polymer layer and a second via hole pattern in the first via hole pattern respectively;
        a seed layer covering sidewall and bottom surface of the redistribution pattern and sidewall and bottom surface of the second via hole pattern respectively;
        a conductive via plug formed in the second via hole pattern; and
        a conductive redistribution line formed in the redistribution pattern;
    a connection terminal disposed on bottom surface of the plurality of unit redistribution layers and electrically connected to the conductive via plug of a lowermost unit redistribution layer among the plurality of unit redistribution layers;
    a semiconductor device mounted on the plurality of unit redistribution layers; and
    a conductive terminal formed between the semiconductor device and the plurality of unit redistribution layers, and electrically connecting the semiconductor device to the conductive via plug of an uppermost unit redistribution layer among the plurality of unit redistribution layers,
    wherein upper surface of the second polymer layer, upper surface of the conductive redistribution line and upper surface of the conductive via plug in each of the plurality of unit redistribution layers are substantially coplanar.

2. The semiconductor package of claim 1, wherein each of the first polymer layer and the second polymer layer comprises a negative photosensitive polymeric material.

3. The semiconductor package of claim 2, wherein at least one of the first polymer layer and the second polymer layer comprises a photosensitive polyimide (PSPI) resin.

4. The semiconductor package of claim 1, wherein each of the conductive via plug and the conductive redistribution line includes a suppressor.

5. The semiconductor package of claim 4, wherein a first concentration of the suppressor in the conductive via plug is lower than a second concentration of the suppressor in the conductive redistribution line.

6. The semiconductor package of claim 5, wherein the suppressor comprises at least one of the polyesters, polyethylene glycol, and polypropylene glycol.

7. The semiconductor package of claim 1, wherein the seed layer comprises a hetero metal layer different from material of the conductive via plug and/or the conductive redistribution line.

8. The semiconductor package of claim 7, wherein a thickness of the hetero metal layer on sidewall of the at least one of the conductive via plug and the conductive redistribution line increases away from the bottom surface of the at least one of the conductive via plug and the conductive redistribution line.

9. The semiconductor package of claim 8, wherein the hetero metal layer includes at least one of copper (Cu), titanium (Ti), titanium tungsten (TiW), titanium nitride (TiN), tantalum (Ta), tantalum nitride (TaN), chromium (Cr) and aluminum (Al).

10. The semiconductor package of claim 1, wherein the conductive via plug of each of the plurality of unit redistribution layers is vertically and electrically connected to adjacent conductive via plug of neighboring unit redistribution layer among the plurality of unit redistribution layers.

11. The semiconductor package of claim 1, wherein the first via hole pattern completely overlaps the second via hole pattern.

12. The semiconductor package of claim 11, wherein a first diameter of the first via hole pattern is greater than a second diameter of the second via hole pattern.

13. The semiconductor package of claim 1, wherein a diameter of the second via hole pattern is substantially greater than a width of the conductive redistribution line.

14. The semiconductor package of claim 1, wherein at least a portion of the second polymer layer is disposed on a side surface of the first via hole pattern.

15. The semiconductor package of claim 1, wherein a plurality of unit redistribution layers include three or more of unit redistribution layers.

16. The semiconductor package of claim 1, wherein a portion of the seed layer covering the bottom surface of the redistribution pattern is in direct contact with the first polymer layer.

17. A semiconductor package comprising:
    a package substrate; and
    one or more semiconductor devices mounted on the package substrate,
    wherein the package substrate comprises:
        a first unit redistribution layer comprising a first conductive via plug and a first conductive redistribution line, which are buried in a first interlayer dielectric; and
        a second unit redistribution layer formed directly on the first unit redistribution layer and comprising a second conductive via plug and a second conductive redistribution line, which are buried in a second interlayer dielectric,
    wherein a sidewall and a bottom surface of each of the second conductive via plug and the second conductive redistribution line are lined with a hetero metal layer having a hetero metal that is different from a metal or metals of the second conductive via plug and the second conductive redistribution line, and
    the second conductive via plug vertically overlaps the first conductive via plug with the hetero metal layer interposed therebetween.

* * * * *